United States Patent [19]

Stubbs

[11] Patent Number: 4,812,996

[45] Date of Patent: Mar. 14, 1989

[54] SIGNAL VIEWING INSTRUMENTATION CONTROL SYSTEM

[75] Inventor: David D. Stubbs, Portland, Oreg.

[73] Assignee: Tektronix, Inc., Beaverton, Oreg.

[21] Appl. No.: 935,369

[22] Filed: Nov. 26, 1986

[51] Int. Cl.$^4$ .................. G06F 15/74; G01R 23/00
[52] U.S. Cl. .................. 364/487; 324/77 B; 324/121 R; 364/485; 364/521
[58] Field of Search .......... 324/77 R, 77 A, 77 B, 324/77 C, 77 CS, 121 R; 364/484, 485, 486, 487, 521

[56] References Cited

U.S. PATENT DOCUMENTS

| | | | |
|---|---|---|---|
| 4,065,664 | 12/1977 | Kristof et al. | 364/487 |
| 4,072,851 | 2/1978 | Rose | 364/487 |
| 4,104,725 | 8/1978 | Rose et al. | 364/487 |
| 4,162,531 | 7/1979 | Rode et al. | 364/487 X |
| 4,244,024 | 1/1981 | Marzalek et al. | 364/571 X |
| 4,253,152 | 2/1981 | Holdway | 324/77 B X |
| 4,507,740 | 3/1985 | Star et al. | 364/487 |
| 4,660,150 | 4/1987 | Anderson et al. | 364/485 |

Primary Examiner—Felix D. Gruber
Assistant Examiner—Edward R. Cosimano
Attorney, Agent, or Firm—Alexander C. Johnson, Jr.; Robert S. Hulse

[57] ABSTRACT

A signal viewing instrumentation control system includes a programmable test instrument, a computer having an input keyboard and/or mouse, a CRT display and a communications interface for the computer to communicate with the test instrument. The test instrument can be a digitizer, a spectrum analyzer, a power supply or a signal generator. The system includes software for the user to interactively control the test instrument through the computer. The software includes a functional characterization of the test instrument for inversely transforming a generic output for the instrument into a generalized set of control setting commands for controlling operation of the instrument. The user can graphically enter into the computer a user-specified output for the instrument. The computer converts the graphically-specified output into a specific set of the control setting commands and transmits the specific commands to the test instrument to control its operation. The user can thereby interactively control the test instrument to provide an output function replicating a desired output function without having to enter a control settings to the test instrument either manually or as program language control statements.

38 Claims, 21 Drawing Sheets

SIGNAL VIEWING: GENERALIZED BLOCK DIAGRAM FOR INSTRUMENTATION CONTROL

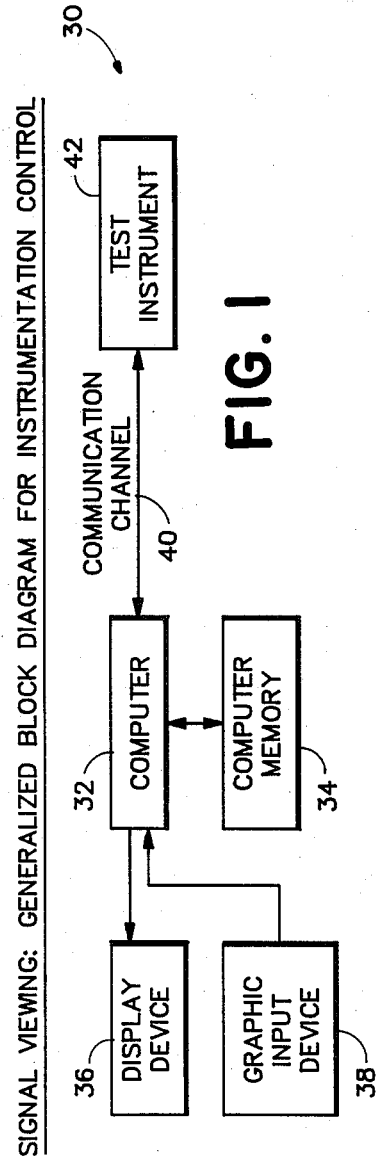
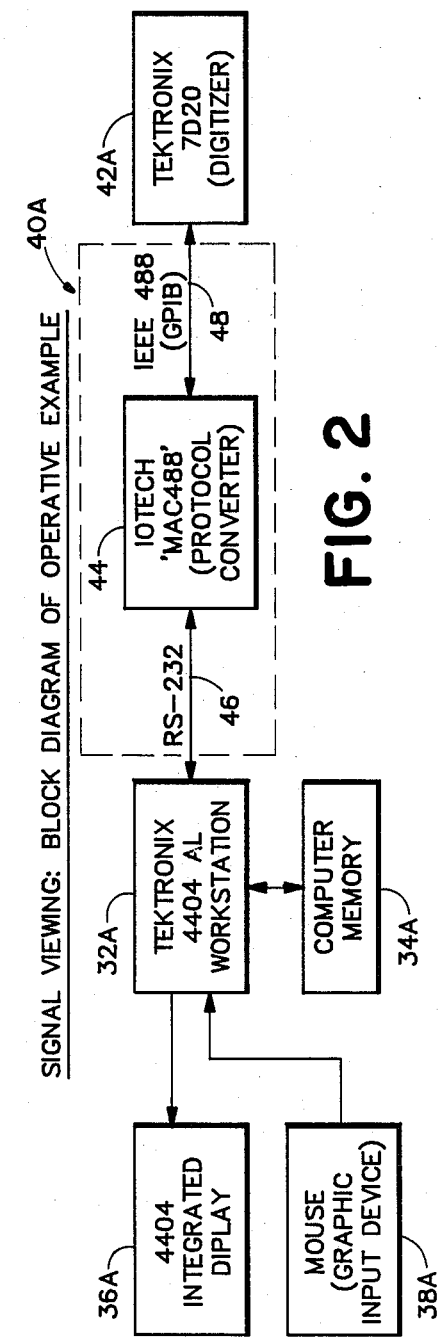

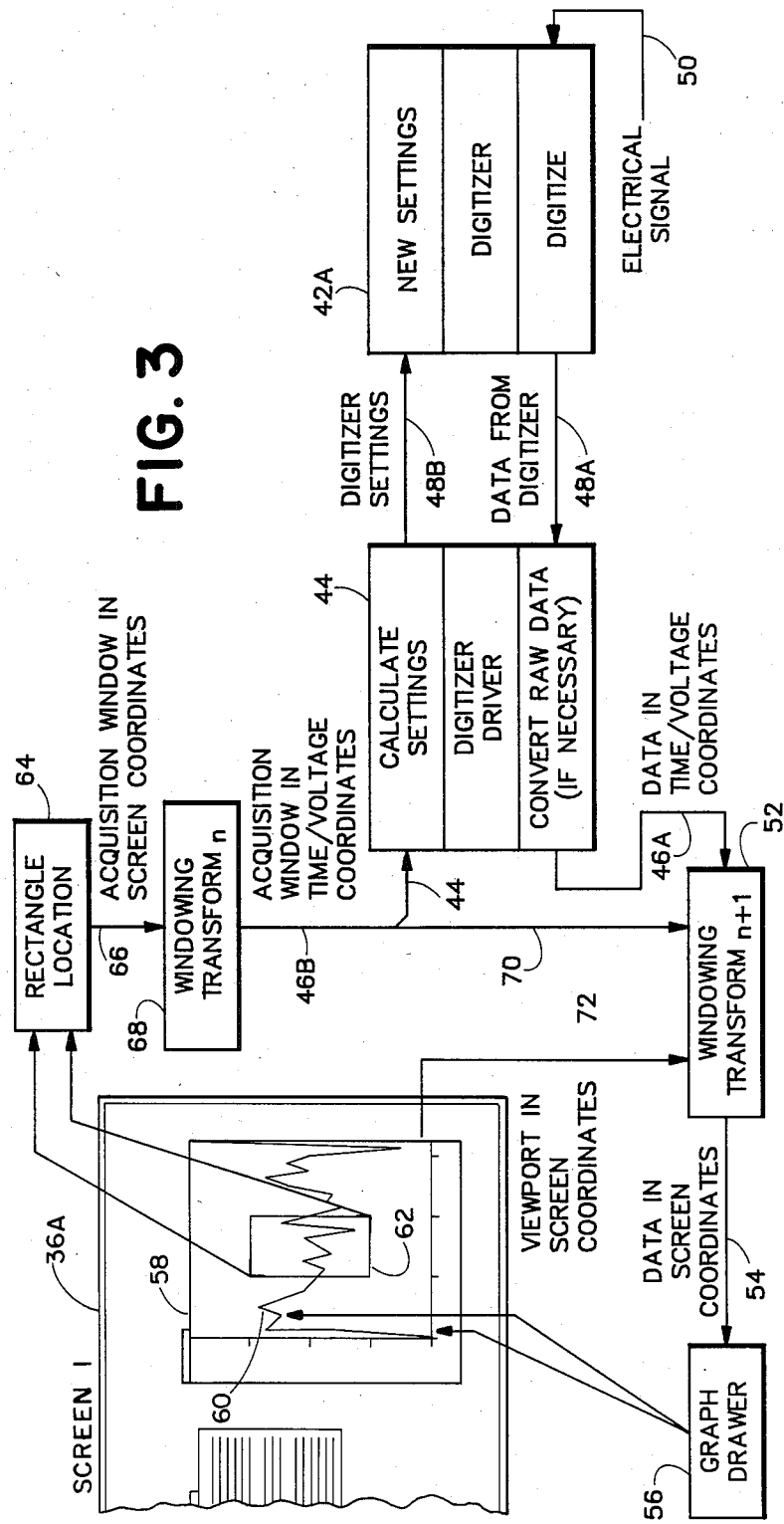

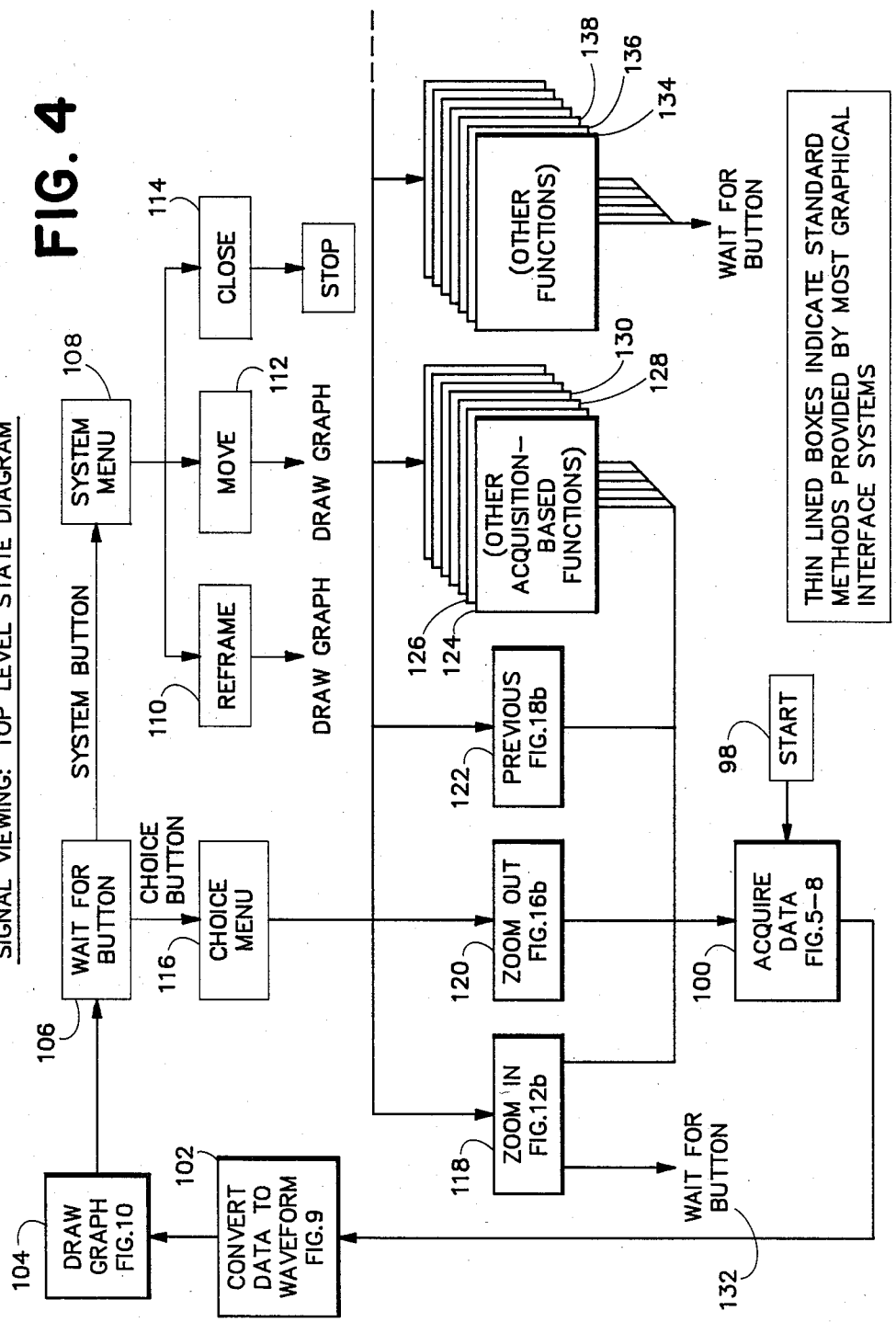

SIGNAL VIEWING: 'ACQUIRE DATA' STATE DIAGRAM

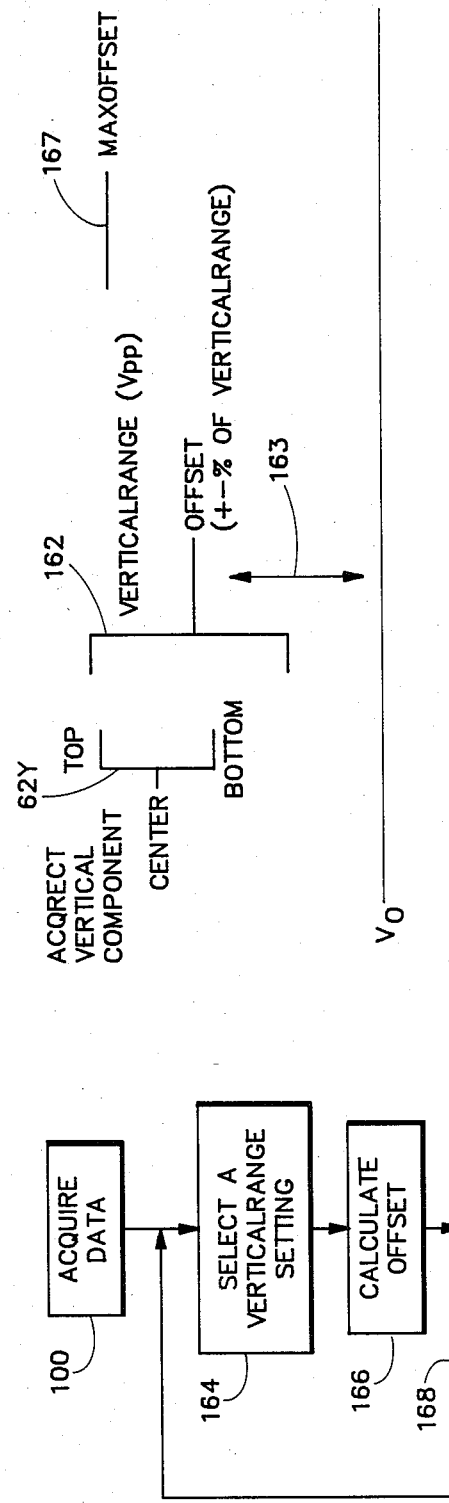
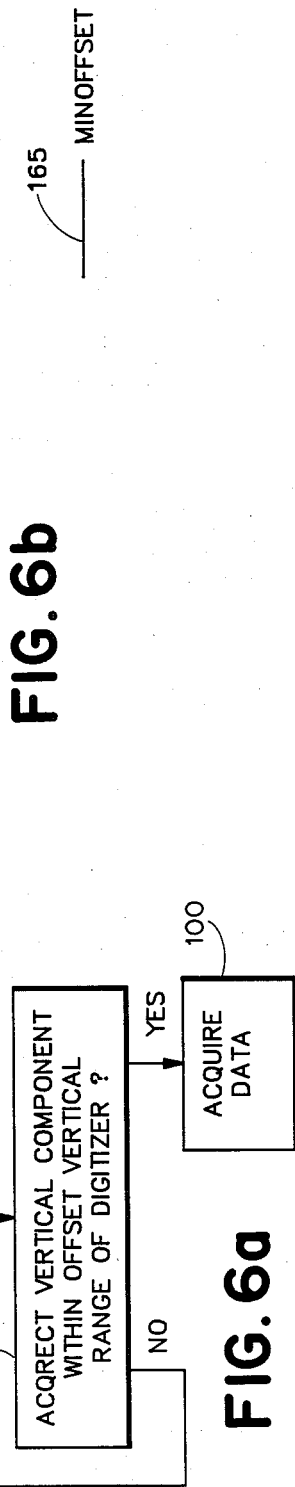
FIG. 6b
FIG. 6a

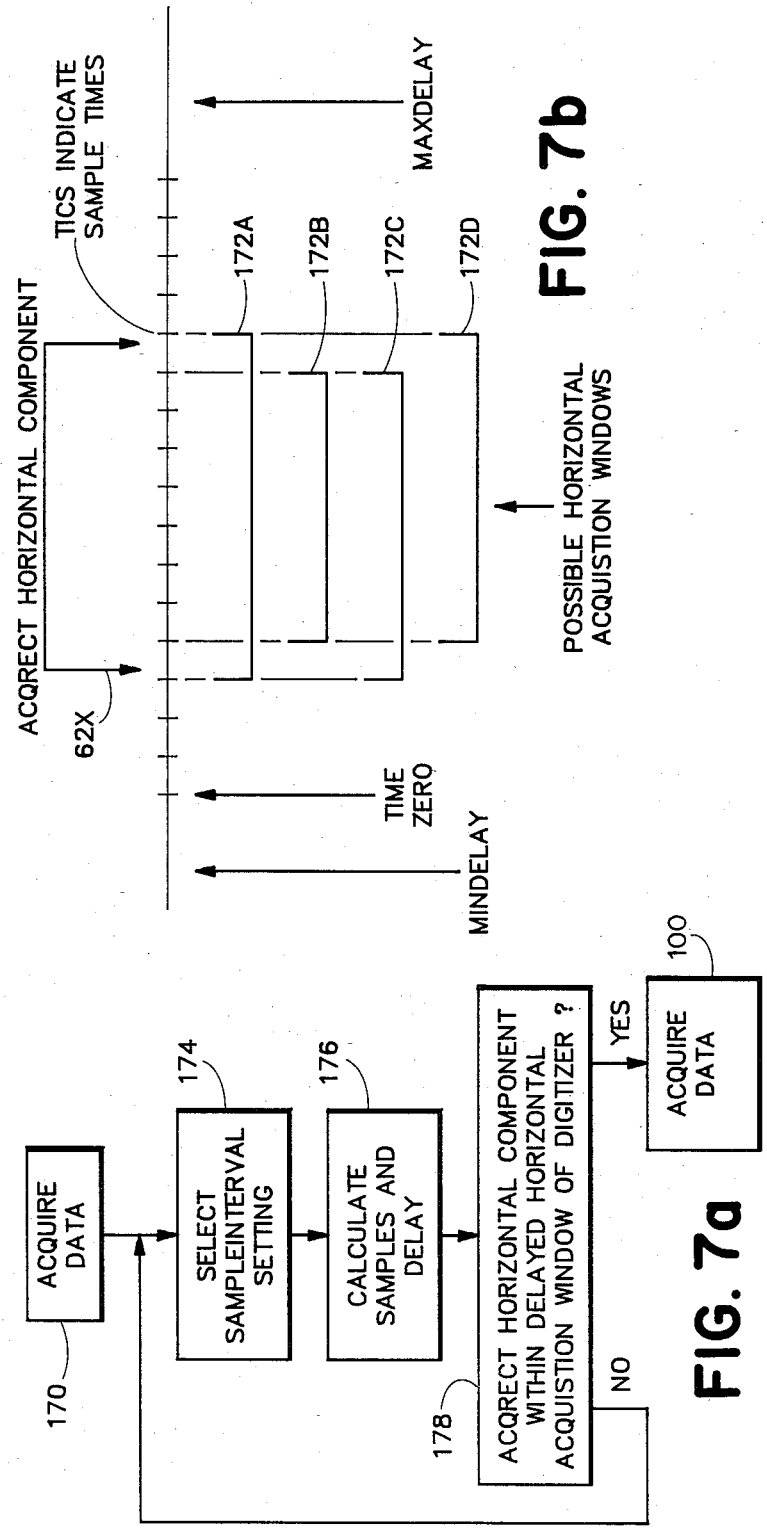

SIGNAL VIEWING: 'PREVIOUS WINDOW' STATE DIAGRAM

SIGNAL VIEWING INSTRUMENTATION CONTROL SYSTEM

RELATED APPLICATION DATA

This application is related to commonly-assigned U.S. patent application Ser. No. 07/007,234, filed Jan. 27, 1987, by D. Jordan et al., entitled BLOCK DIAGRAM EDITOR SYSTEM AND METHOD FOR CONTROLLING ELECTRONIC INSTRUMENTS.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyrights whatsoever, ® 1988 Tektronix, Inc.

BACKGROUND OF THE INVENTION

This invention relates generally to the operation and control of programmable test instrumentation. More particularly, it relates to a system and method for computer-controlling a programmable test instrument for acquiring or generating signals in two dimensions. Typical such programmable instruments include digitizers (voltage vs. time), spectrum analyzers (amplitude vs. frequency), power supplies (voltage vs. current) and waveform generators (amplitude vs. time).

Stand-alone (or manual) instruments are "programmed" (or set up) by pressing button and/or turning knobs on their front panels. These controls directly affect the configuration and thus the operation of the instrument. These controls are often labeled in terms of the circuit or circuit function they affect (e.g., "gain" control on an oscilloscope vertical amplifier), rather than in terms of the function the user wants to accomplish (e.g., "increasing vertical resolution," or "magnifying"). The controls are also commonly defined in terms of one another (e.g., vertical offset defined as percent of vertical scale) and manipulating one control can thus affect others.

An example of such an instrument is a microprocessor-controlled oscilloscope disclosed in Rode et al., U.S. Pat. No. 4,162,531.

Through a variety of hardware techniques, instruments have been connected to computers so that the computers—under program control—can send messages that will establish instrument settings (thus controlling the instrument) and receive information from instruments U.S. Pat. No. 4,507,740 to Star et al. discloses an example of such a test instrument, a dual channel digitizer controlled by a local microprocessor having external communications for programming the microprocessor from a main computer.

High-level programming languages (e.g., BASIC and FORTRAN) have been extended to provide means to express the desired instrument settings. Beneath (or behind) these language extensions are drivers (or subroutines) which interpret the control expressions in the high-level language. These drivers convert the meaning of the expressions into the communication protocol required to control the instrument. For certain instruments, drivers may also report the state of the instrument (e.g., the control settings and error status information) as well as data that the instrument may sense.

These drivers are essentially the same as those computer operating systems used to communicate with peripheral devices such as terminals, disk drives, and magnetic tape drives. In these programmable systems, the user must communicate with the instrumentation in terms of its conventional control settings (e.g., amount of vertical offset, vertical scale factor, etc.). The user must understand not only how to control the test instrument but also how to communicate the desired controls in the program language.

Many high-level languages have also been extended to provide means for graphically displaying data returned from test instruments (e.g., digitizer). These languages rely on windowing modules (subroutines) to convert acquired data (e.g., digitized signals) from the coordinate system that the data represents (e.g., time vs. voltage) into the coordinate system of the display device (CRT). With the data transformed into display coordinates, graphing modules (subroutines) interpret language commands like DRAWline and FILLAear. Commands like these take display coordinate arguments and produce instructions in the form that the display device requires to render the requested figure.

High-level language elements, windowing modules, and graphing modules have been widely used to produce graphical representations of data stored in computer memory. They have also been used in conjunction with graphic input devices (e.g., thumbwheels, joysticks, mice, etc. which control a display cursor) to interpret the cursor's screen location in terms of the coordinate system of the displayed data.

This type of display system enables the user to display the stored data in different scales, but the resolution of the data displayed is limited to that which is stored. Zooming in on a portion of a waveform cannot add any more detail about the waveform than was originally stored. Also, the stored data is limited to the record length of data stored. Thus, zooming out beyond the dimensions of stored data does not make more data available. To overcome both of these limitations requires the user to reprogram or reset the test instrument.

In conventional manual operation of a test instrument, e.g. a digitizer, the user operates the digitizer's controls in response to the graphical presentation of the acquired data. Though the data is typically presented in a time/voltage coordinate system, the user must manipulate several, sometimes interactive, controls until the acquired data is acceptably presented on the display. In the manual situation, calculation of settings is very rare. Instead, users search through the settings, with little regard for their value, until the picture looks right.

The operation of a programmable test instrument, such as a digitizer, from high-level languages requires forethought and calculation. Thus, programmable instruments are extremely difficult to use in an interactive manner. When possible, interaction is achieved by allowing selection from a menu of choices or by requiring the user to type in a setting value that is read by a program and passed through the device driver to the digitizer. When the new settings are received, the digitizer acquires new data, returns it through the driver to windowing and graphing routines for presentation on the display. The user then sets goals in terms of the displayed data, but must transform these goals into terms of digitizer settings in order to act. If more than one instrument is being used, each must be set separately. All of this entails much complexity, and required substantial expertise, time and careful work to accomplish successfully.

Accordingly, a need remains for an improved method and apparatus for controlling test instrumentation to set the dimension of a signal acquisition or generation window for a test instrument and graphically displaying the signal as actually detected.

SUMMARY OF THE INVENTION

One object of the invention provides improved means for controlling through a computer workstation interface, a programmable test instrument for acquiring or generating signals in two dimensions.

A second object of the invention is to provide a "single channel of access" to engineering, testing, research, etc. resources in a test system.

Another object is to eliminate the need for test instrument front panel controls and display by providing workstation-based control and thereby reduce the cost of a digitizer or other programmable test instrument.

A further object is to eliminate the need to search through test instrument settings and thereby reduce the time required for a user to establish or modify settings.

Yet another object is to eliminate the user's having to translate goals in time/voltage (or other signal feature) terms to actions in terms of test instrument settings.

An additional object is to eliminate the user's perception of the interactions among test instrument controls.

The invention provides a method and apparatus for controlling a test instrument having a predetermined set of computer-programmable control settings. The apparatus comprises a computer having external communications means for transmitting control setting commands to the test instrument and user input means for a user to enter data to the computer. Preferably, a display means is also provided for visibly displaying data from the computer to a user, including two-dimensional signal data, in graphical form. The computer is programmed to provide means defining a functional characterization of the test instrument for inversely transforming a generic output for the instrument into a generalized set of control setting commands for controlling operation of the instrument. The computer further includes means responsive to the user entering data that defines a user-specified output for the instrument, for inversely transforming the user-specified output in accordance with the functional characterization to produce a specific set of said control setting commands. The communication means then transmits the specific set of control setting commands to the test instrument to operate it in accordance with specific control settings that cause it to produce an output replicating the user-specified output.

In a preferred embodiment, the invention combines a computer and display having windowing and graphing capabilities with a programmable electronic test instrument, such as a digitizer and digitizer driver, in such a way that the user can directly control the test instrument's signal acquisition window. The coordinates of a desired signal acquisition window established on the display by the user are transformed into two-dimensional signal feature (e.g., time/voltage) settings. These settings are used to control the test instrument to determine the signal acquisition window within which the test instrument is to obtain a test signal from a device under test.

The same principles can likewise be employed with other programmable test instruments that acquire two-dimensional signals, such as a spectrum analyzer which acquires signals in frequency-amplitude terms. The basic principles of the invention can similarly be employed to control programmable test instruments for stimulating a device under test, such as a power supply or a signal generator. Also, multiple stimulating and signal acquisition test instruments can be controlled, with the computer and its display and input means serving as a single channel of access to the test instrumentation system or other system to be controlled.

This invention enables a user to think and work with a test instrumentation system in terms of the two-dimensional graphical features being studied and to manipulate the test instrumentation directly in terms of those features. It is unnecessary for the user to translate the desired representation of test data into test instrumentation settings, or into computer commands to make such settings, to obtain the desired test data. Moreover, this technique eliminates the need for the user setting the instrument controls to compensate for interactions among the controls.

The foregoing and other objects, features and advantages of the invention will become more readily apparent from the following detailed description which proceeds with reference to the drawings.

BRIEF DESCRIPTION OF THE DRAWINGS

FIG. 1 is a generalized block diagram for signal viewing instrumentation control in accordance with the invention.

FIG. 2 is a block diagram of an operative example of the system of FIG. 1 for controlling a digitizer.

FIG. 3 is a functional block diagram illustrating data flow and display screen operation in the instrumentation system of FIG. 2.

FIG. 4 is a top level state diagram for a computer program for implementing signal viewing control of a digitizer in accordance with the present invention.

FIG. 6a is a state diagram of the "vertical settings" state shown in FIG. 5a.

FIG. 6b graphically illustrates the procedure for determining the vertical settings in the state of FIG. 6a.

FIG. 7a is a state diagram of the "horizontal settings" state shown in FIG. 5a.

FIG. 7b graphically illustrates the procedure for determining the horizontal settings in the state of FIG. 7a.

Figures 5A, 5B:
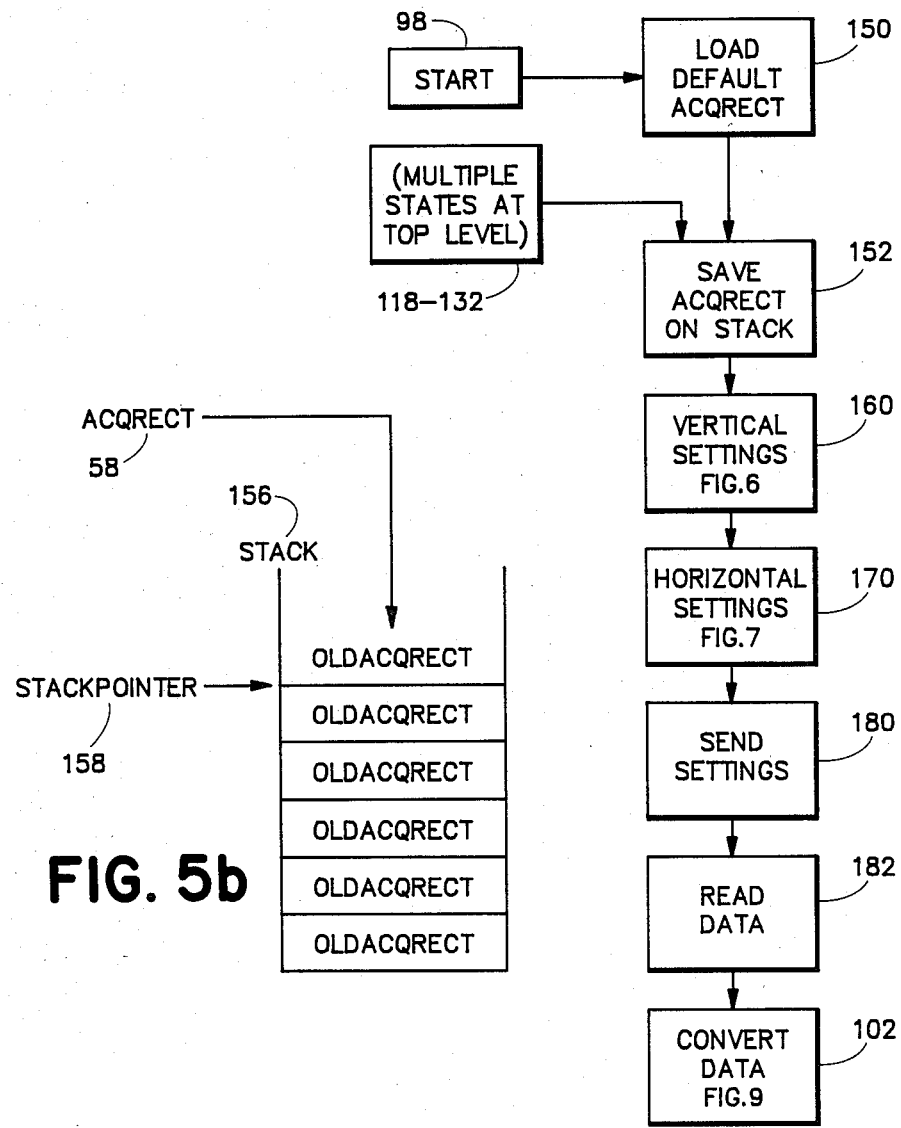
FIG. 5a is a state diagram of the "acquire data" state shown in FIG. 4.
FIG. 5b is a diagram of a storage mechanism, a stack, for storing old acquisition windows.

APPENDIX A is a listing defining the variables used in a Smalltalk-80 program for determining settings to be sent to a digitizer in accordance with the invention.

APPENDIX B and APPENDIX C are Smalltalk-80 listings, with comments, of preferred methods for determining the vertical and horizontal settings to be sent to a digitizer.

APPENDIX D is a Smalltalk-80 listing, with comments, of a method for setting a combined operating point of a power supply in accordance with the invention.

DETAILED DESCRIPTION

General Arrangement and Operation

A signal viewing instrumentation control system 30 according to the invention is shown in FIG. 1. Such a system comprises a general purpose digital computer 32 having an associated computer memory 34. A user interacts with the computer through a display device 36, such as a CRT monitor, and a graphic input device 38, such as a three-button mouse 38A (FIG. 2) or a conventional computer keyboard with a cursor control arrows (not shown). The computer 32 is connected for bi-directional communications via a digital communications channel 40 to a programmable test instrument 42.

An operative example of the system of FIG. 1 is illustrated in FIG. 2. The computer is provided by a Tektronix 4404 Artificial Intelligence workstation 32A, which is commercially available with a compatible computer memory 34A. The preferred form of display device for use with such a computer is a Tektronix 4404 integrated CRT display 36A. A mouse 38A is the preferred form of graphic input device, although a workstation 32A also conventionally includes a keyboard (not shown). For purposes of this example, which is continued throughout the remainder of this portion of the description, the test instrument that is being controlled by and supplies test data to the computer is a digitizer 42A, such as a Tektronix Model 7D20 Digitizer. Data communications between workstation 32A and digitizer 42A are provided by a bi-directional communication channel shown by dashed box 40A, which includes an IOtech Model MAC488 bus convertor 44, a bi-directional RS-232 data bus 46 communicating between workstation 32A and protocol convertor 44, and an IEEE 488 (GPIB) bi-directional data bus 48 communicating between bus convertor 44 and digitizer 42A.

Referring to FIG. 3, the system of FIGS. 1 and 2 is illustrated in a functional block diagram to show data flow and display screen operation. When actuated, the digitizer 42A receives an electrical signal in analog form from a device under test (not shown) via physical connection 50. The digitizer conventionally digitizes the analog signal and transmits raw digital data over the GPIB bus via communication path 48A to the digitizer driver. Path 48A comprises the three elements illustrated in FIG. 2. Raw digitizer data flows over the GPIB bus, indicated by arrow 48, to the protocol converter 44. The raw data is transmitted over the RS-232 bus, as indicated by arrow 46, to workstation 32A.

Returning to FIG. 3, the digitizer driver converts raw data to time/voltage coordinates and returns the coordinates over software communication path 46A. Within workstation 32A, programming, described in further detail below, performs a windowing transform, indicated by functional block 52, which transforms the data from time/voltage coordinates into screen coordinates. This data is then transferred as indicated by arrow 54, to a graph drawer, indicated by functional block 56. The graph drawer includes conventional graphing and CRT display control software, which causes a graphical representation of the electrical signal to be displayed in a window 58 on CRT display 36A as a waveform 60.

In accordance with the invention, the user can identify a portion of the waveform that the user desires to acquire and display in greater detail. Conventional windowing and graphing software in the Smalltalk-80 language provides a capability of graphically defining a rectangular portion of a screen display, recalling from computer memory the data pertaining to the selected portion of the displayed waveform and displaying such selected portion in enlarged format within window 58. The accuracy of the enlarged displayed waveform is limited, however, to the accuracy and resolution with which the electrical signal was acquired and digitized to provide waveform 60. The invention enables the user to overcome this limitation by reacquiring a new electrical signal and waveform to be displayed, by adopting rectangle 62, as specified by the user, as a desired acquisition window for controlling the digitizer to reacquire the electrical signal.

Accordingly, the invention includes software, indicated by functional block 64 for establishing the location and size of the desired acquisition window. The window location is transmitted, as indicated by arrow 66, in the form of screen coordinates for the corner points of rectangle 62, to a windowing transform function, indicated by block 68. The windowing transform function converts rectangle 62 from the screen coordinate system to the time/voltage coordinate system of the signal, producing the acquisition window. This new window is output along path 46B. Upon receiving the acquisition window in time/voltage coordinates, digitizer driver 44 calculates new digitizer settings and transmits these over the GPIB bus to the digitizer, as indicated by arrow 48B.

Such coordinates are also input within the computer to windowing transform 52, as indicated by data flow path 70. Similarly, location and dimensions of window 58 are input in the form of screen coordinates to the windowing transform as indicated by data flow path 72. These data are employed, as described hereinafter, in redefining the windowing transform of block 52 that is to be applied to the next set of digitized electrical signal data to be acquired.

Controlled by these new settings, digitizer 42A acquires a new electrical signal from the device under test, for a signal acquisition window that corresponds as closely to desired acquisition windows 62 as the built-in setting options of the particular model of digitizer permit.

The electrical signal is acquired and digitized according to the new acquisition window. The digitized waveform is input to the workstation 32A, being converted to time/voltage coordinates by the digitizer driver 44. The new data is processed through the windowing transform 52, as modified by the screen coordinates and time/voltage coordinates input via paths 70 and 72 and forwarded to graph drawer 56 for display on the screen. The new signal, which approximates that portion of waveform 60 within rectangle 62 but in greater detail, is then displayed in enlarged form within display window 58. The succeeding sections of this description describe the structure and operation of the preferred form of software for implementing the above-described system in greater detail. Preferably, the present invention is incorporated into an overall test instrument and experiment management system such as that described in the above-referenced related patent application, but can be operated by itself.

Description of Digitizer Control Software

FIG. 4 shows a top level state diagram for software programmed in computer memory 34A. This description proceeds in the same manner as the foregoing general description, commencing with a program START 98, which enters the routine at an "acquire data" state indicated by block 100. Once initial data is acquired, control of the program shifts to the "convert data to waveform" state, indicated by block 102. Blocks 100 and 102 include the functions performed by the digitizer driver 44. Following conversion, the waveform data is input to a "draw graph" state 104. In this state, a graphing software module causes the waveform to be displayed on display screen 36. After displaying the waveform, program control is transferred to a "wait" state 106.

In the "wait" state, the computer waits for the user to depress one of the three control buttons on mouse 38A. If the user presses the system button, program control switches to the system menu state 108. From this state, the user can select from among several conventional graphing software functions: a reframe function 110, a move function 112, and close function 114. Operation in the system menu state 108 is conventional and therefore need not be further discussed.

When the user selects the choice button on the mouse, this action causes conventional software to display a choice menu, as indicated by block 116. In accordance with the invention, the choices that are displayed in the choice menu enable the user to select from among several options, to determine the choice of a signal acquisition window to be used by the digitizer 42A in acquiring the digitizing a next electrical signal data set.

The first choice is the "zoom in" state, indicated by block 118, operation of which was generally discussed above. The second choice is the "zoom out" state, indicated by block 120, which enables the user to enlarge the signal acquisition window by a predetermined amount. Other states that the user may select include a recalling a previous window stored in computer memory 34 (block 122) and "vertical" and "horizontal" states, indicated by blocks 124 and 126, which enable the user to control the signal acquisition window in a single dimension at a time. Similarly, the user can select a trigger level for the acquisition window (block 128), select a trigger slope (block 130), or perform other acquisition-based functions as called for by the particular kind of instrument being used.

All of these functions return to the "acquire data" state 100 upon execution. The "zoom in" state includes a "wait" state 132, which operates while the user is selecting a window size for rectangle 62. The rectangle coordinates are finally established by the user depressing the third, or pointing, mouse button to indicate the desired acquisition rectangle's origin, moving the mouse while holding the third button down until the desired rectangle has been indicated, and then releasing the button. This action returns the control to the "acquire data" state 100.

Additional, conventional control functions can also be provided on the choice menu, such as cursor control (block 134), delta cursors (block 136), save/use data control (block 138), and others as will be understood by those skilled in the art.

FIG. 5 illustrates the "acquire data" state 100 in greater detail. Operation of the signal viewing program commences at START block 98. Upon startup, the first procedure is to load default settings for an initial signal acquisition window of the digitizer, as illustrated by block 150. These settings are saved by procedure 152, which inputs the settings as acqRect 58 into a pushdown stack 156, as shown in FIG. 5b, operation of which is conventionally controlled by use of a stack pointer 158. The default settings are then input to a "vertical settings" state, which is illustrated in general by block 160 and in further detail in FIG. 6A. Once the vertical settings are established, program control is shifted to a "horizontal settings" state as shown generally in block 170 and in further detail in FIG. 7A.

Once the vertical and horizontal settings have been established, program control is shifted over to a "get data" state. In the "get data" state, the first step of which is a "send settings" procedure (block 180). In this procedure, the vertical and horizontal settings that were previously determined are sent to the digitizer via the digitizer driver, using the appropriate protocols for RS-232 and IEEE488 communications. These settings are embodied in computer-type commands formatted so as to be understood and implemented by the programmable digitizer. The digitizer responds by executing the commands and acquiring a new electrical test signal from the device under test for the signal acquisition window as specified in the settings commands. A portion of the electrical signal within the acquisition window is digitized in accordance with the settings and formatted for transmission as a digital data stream back to the computer. Next, a "read data" procedure (Block 182) causes the computer to acquire the digital data from the digitizer via the IEEE488 and RS-232 buses, with the appropriate protocol conversion being made by protocol converter 44.

Figure 8:
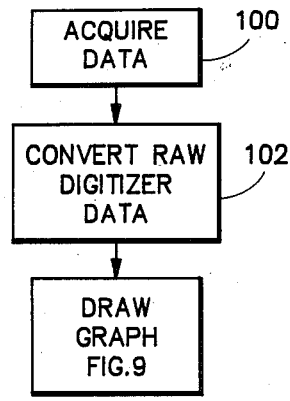
FIG. 8 is a state diagram of the "convert to waveform" state shown in FIG. 4.

Referring to FIG. 8, the acquired data is passed to a "convert data to wave form" state 102. In this state, the raw data from the digitizer, for the electrical signal acquired within the previously specified acquisition window, is transformed into a waveform data structure conforming to the requirements of the data formats required by the graphing software for displaying graphical data on display 3A. Some models of digitizer return their data as an array of numbers scaled correctly to represent voltages, as well as returning information about the horizontal scale factor (time between elements), location of time 0 (or location in time of an array element), and the horizontal and vertical units of measure. For digitizers that behave in this manner, the "convert to waveform" procedure is not required.

Figure 9:
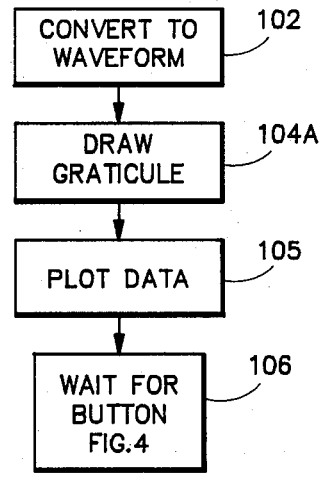
FIG. 9 is a state diagram of the "draw graph" state shown in FIG. 4.

The next step in the operation of the signal viewing of software is the "draw graph" state 104, detailed in FIG. 9. In this state, the first procedure is an optional "draw graticule" procedure 104A. This procedure draws a graph graticule, if required, and relabels the dimensions on the axis as necessary. The next procedure is "plot data" (block 105). This procedure transforms each element of the waveform in the waveform data structure created by pocedure 102 from waveform coordinates to screen coordinates. The screen coordinate points for the waveform are then displayed according to applications requirements, e.g. within the boundaries of window 58, on display 36 (FIG. 3). An example of this software is included in the Tektronix Plot-10 (TM) software, which is commercially available.

After the new waveform is displayed, program control shifts to the "wait" state 106. A discussion of operation of the signal viewing software from "choice menu" state 116 is presented after a more detailed discussion of operation in the "vertical settings" and "horizontal settings" states.

Vertical and Horizontal Settings

Referring to FIG. 5a, whenever the user specifies an acquisition rectangle 62 (FIG. 3), the computer needs to determine appropriate vertical and horizontal component settings to send to the digitizer. Any desired acquisition rectangle (AcqRect), such as rectangle 62 in FIG. 3, can be set to have a vertical component 62Y (FIG. 6B) and a horizontal component 62X (FIG. 7B).

A test instrument, such as a digitizer, is conventionally designed to provide a set of ordered vertical ranges, expressed in volts peak-to-peak, and commonly called the range setting. A selected range has a center which is located relative to the origin (zero volts) by an amount of offset 163, conventionally expressed as a percentage, +or −, of vertical range. Finally, the test instrument is constrained to operate within a range of minimum and maximum offsets (minOffset 165 and maxOffset 167). An offset outside of this range would cause the range 162 to exceed the upper or lower limits of the instrument's operational capability.

As discussed above, a user of a manually-controllable test instrument manipulates the range and offset controls until the display "looks right." This is done by interactively changing the range setting to obtain the proper size of display of the desired signal and altering the offset setting whenever a change in the range setting causes a portion of the waveform to be lost above or below the signal viewing area. This kind of interactive control cannot conveniently be performed on a programmable test instrument, because of the need to translate changes in settings into computer commands for controlling the settings.

The present invention eliminates this difficulty by enabling the user to graphically specify the desired acquisition window 62, having a vertical component 62Y and a horizontal component 62X. By procedures 160 (FIG. 6a) and 170 (FIG. 7a), the system can automatically determine from the desired acquisition rectangle components, the vertical and horizontal component settings for the test instrument that best fit the desired acquisition rectangle.

Procedure 160, shown in FIG. 6a, automatically determines the vertical settings for the test instrument that best fit the vertical component 62Y of the desired acquisition rectangle 62. The first step in the "vertical settings state 160" is to select from a prestored range table, a range setting, as shown by block 164. The next procedure, shown in block 166, calculates an offset value—within the limits of prestored minOffset 165 and maxOffset 167—that most nearly centers the range 162 around the acquisition rectangle's vertical component 62Y, without violating the minimum and maximum offset constraints of the instrument. The last procedure, shown in block 168, determines whether the selected range setting and calculated offset setting combine to encompass the desired acquisition rectangle vertical component 62Y. If they do not, and there remain range settings in the table to check, control is returned to block 164 and another range setting is selected and tested as described above.

Briefly, this procedure calls for choosing the smallest range setting in volts peak-to-peak and offset such that:
minOffset $\leq$ offset $\leq$ manOffset;
acqRect top $\leq$ range * offset/100+range/2; and
acqRect bottom $\geq$ range+offset/100−range/2.
If no combination of range and offset are adequate, the largest range setting should be used. Additionally, the user can be notified of this condition.

An operative example of software implementing the "vertical settings" state in Smalltalk-80 language in workstation 32A appears in the program listing of APPENDIX B. APPENDIX A lists the definitions of the signal viewing variables used above and in APPENDICES B and C. APPENDIX A also includes an example of default settings for the digitizer.

Referring to FIG. 7a, the "horitonzal settings" state 170 similarly determines and sets the digitizer settings for the horizontal component 62X of the desired acquisition rectangle 62. As shown in FIG. 7b, four different horizontal digitizer windows can be established around the horizontal component 62X of the acquisition rectangle.

The first choice is a horizontal acquisition window 172A which completely encompasses the horizontal component 62X, by including the sample point at or immediately before the earliest (or left) edge of the horizontal component and the sample point at or immediately after the latest (or right) edge of the horizontal component.

The second choice is a window 172B that encompasses the horizontal component by including the sample point at or immediately after the earliest (or left) edge of the horizontal component and the sample point at or immediately before the latest (or right) edge of the horizontal component.

The third choice is a horizontal acquisition window 172C that encompasses the horizontal component by including the sample point at or immediately before the earliest (or left) edge of the horizontal component and the sample point at or immediately before the latest (or right) edge of the horizontal component.

The fourth choice is a window 172D that encompasses the horizontal component by including the sample point at or immediately after the earliest (or left) edge of the horizontal component and the sample point at or immediately after the latest (or right) edge of the horizontal component.

Referring to FIG. 7a, the acquisition window's horizontal component is expressed in terms of a number of samples corresponding to the length of the acquisition window's horizontal component 62X, and a delay, also expressed as number of samples, of the beginning of the acquisition window from the origin (time=0). In FIG. 7b, the tic-marks along the horizontal axis indicate time intervals at which the test instrument takes samples. The typical test instrument has a set of available sampling intervals and both a minimum and a maximum delay, all of which are provided to the computer for use in determining the horizontal acquisition window settings for the test instrument.

Referring to FIG. 7a, the first step in "horizontal settings" state 170 is to select a sampleInterval setting, as shown by block 174, from a prestored table of such settings available to the instrument.

The next procedure, shown in block 176, calculates a delay setting (i.e. within the prestored limits of miniDelay and maxDelay) to offset the beginning (or left) edge of the horizontal acquisition window of the digitizer with respect to the beginning (or left) edge of the desired horizontal acquisition window. This setting can be the sample immediately preceding or following the beginning of the desired horizontal component. The test used to select the exact value of delay depends upon the user's choice of horizontal component 172A, 172B, 172C or 172D.

Procedure 176 also calculates the total number of samples that would be produced, given the delay and sampleInterval settings, and limits that number to a prestored value specifying the maximum number of samples to be taken, maxSamples. The test used to select the exact value of delay again depends on the user's choice of horizontal component 172A, 172B, 172C, or 172D.

The last procedure, shown by block 178, determines whether the selected sampleInterval, the selected delay setting, and the calculated number of samples combine to encompass the desired acquisition rectangle horizontal component in the manner desired (i.e. window 172A, 172B, 172C, or 172D). If they do not, and there are sampleInterval settings left to check in the table, control is returned to block 174 and another sampleInterval setting is selected and tested, as described above.

Briefly, this "horizontal settings" procedure calls for choosing the shortest sampleInterval (i.e., most samples per second) such that:

$\text{minDelay} \leq \text{delay} \leq \text{maxDelay}$;
$\text{samples} \leq \text{maxSamples}$;
$\text{acqRect left} \geq \text{Delay} * \text{sample Interval}$; and
$\text{acqRect right} \leq (\text{Delay} * \text{sampleInterval}) + (\text{samples} * \text{sampleInterval})$.

APPENDIX C is a program listing written in Smalltalk-80 language for the "horizontal settings" state, implementing horizontal acquisition window 172A. APPENDIX A defines the signal viewing variables used above and in APPENDIX C.

OPERATION IN MENU CHOICE STATE

Figure 10:
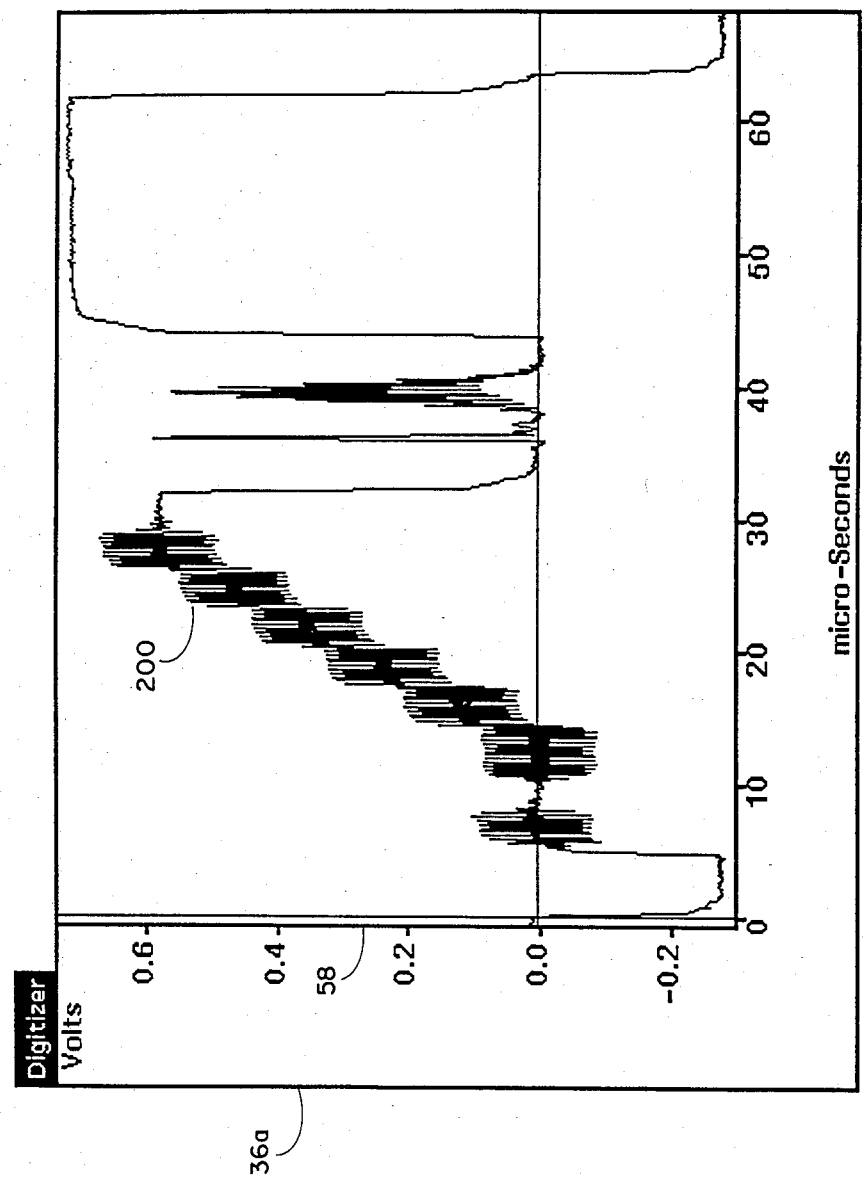
FIG. 10 is an enlargement of the screen of FIG. 3 showing an initial (or default) acquisition window for viewing a first test example of a television Vertical Interval Test Signal (VITS).

Referring back to FIG. 4, after an initial signal has been acquired and a corresponding waveform displayed on the display screen, and the signal viewing program is in the "wait" state 106, the user can invoke the choice menu (block 106) by depressing the choice button on mouse 38A. Referring to FIG. 10, an initial waveform for a television vertical interval test signal (VITS) has been acquired and displayed on display 36a within window 58. The dimensions of the initial acquisition window were set in accordance with the initialization or default settings of procedure 150 (FIG. 5).

Figure 11B:
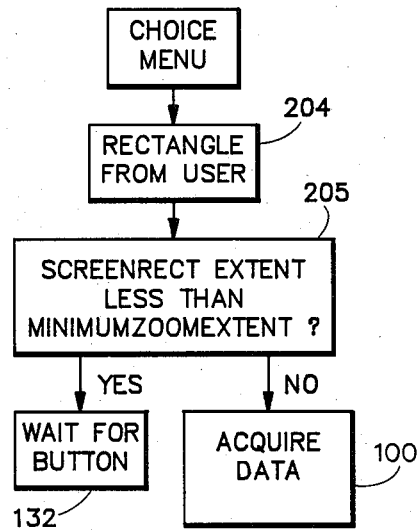
FIG. 11b is a state diagram of the "zoom in" state shown in FIG. 4.
Figure 11A:
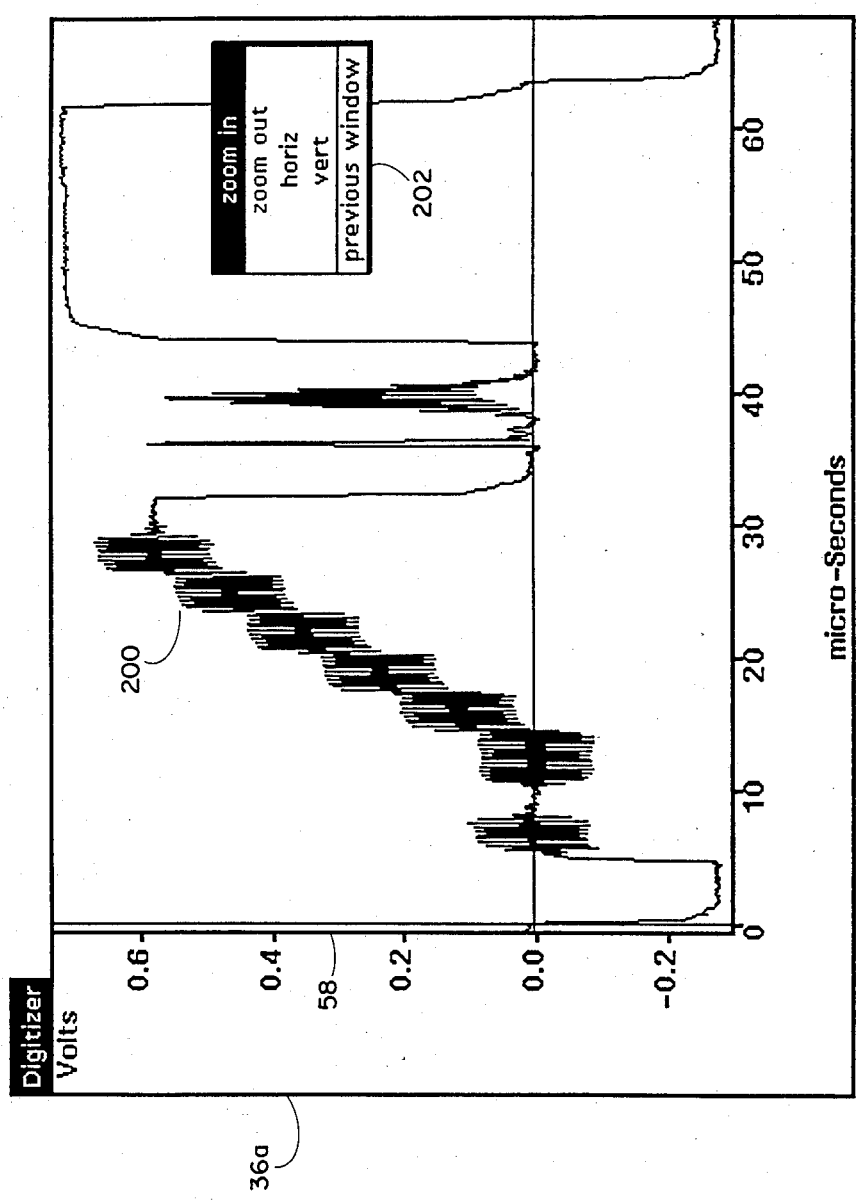
FIG. 11a shows the screen of FIG. 10 with a standard Smalltalk-80 pop-up menu displaying choices of operation available from the Signal Viewing computer program, in which "zoom in" is the selected item.

Referring next to FIG. 11a, when the user presses the choice button on the mouse, a menu 202 is displayed on the screen, in the location of the mouse cursor. The menu displays five commands available to the user, the topmost one of which is initially highlighted. The user can change commands by moving the mouse and thereby the highlight down through the list of commands.

Figure 12:
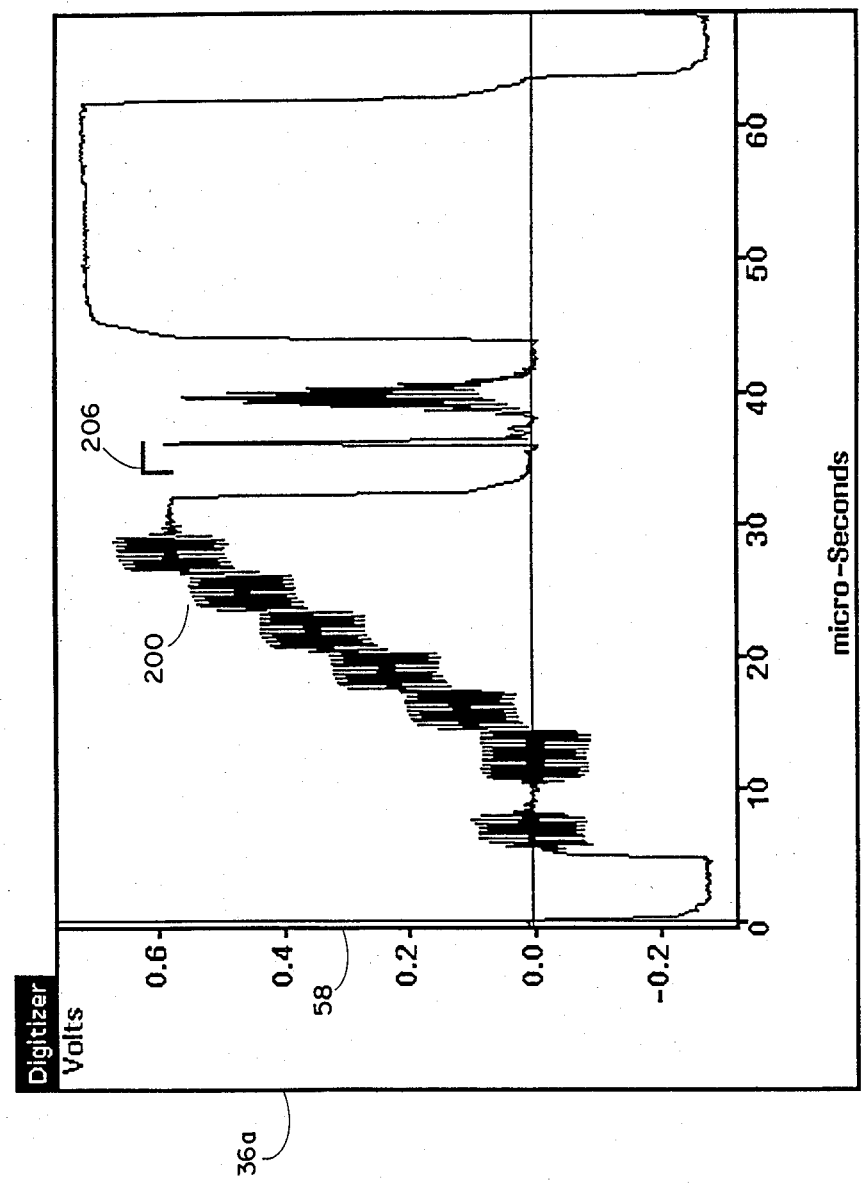
FIG. 12 shows the screen of FIG. 11a after a standard Smalltalk-80 'orgin cursor' (an upper left corner angle bracket) has been displayed and positioned to begin the process of defining the next acquisition window.

Selecting the first command invokes the "zoom in" state, shown in FIG. 11b. The first step in the "zoom in" state, is a "rectangle from user" procedure 204. This procedure is a standard Smalltalk-80 routine that prompts the user to designate a rectangle on the display screen which encompasses a portion of the signal of interest to the user. Referring to FIG. 12, the prompt is in the form of a corner symbol 206 positioned within window 58 on display 36a. Procedure 204 permits the user to locate corner symbol 206 anywhere on the display screen to designate, by pushing and holding down the mouse's pointer button, an upper left hand corner of a desired acquisition window. The location of this designated corner will be interpreted with respect to the acquisition window of the currently-displayed waveform, even if the designated corner is not within the boundary of the displayed graticule 58.

Figure 13:
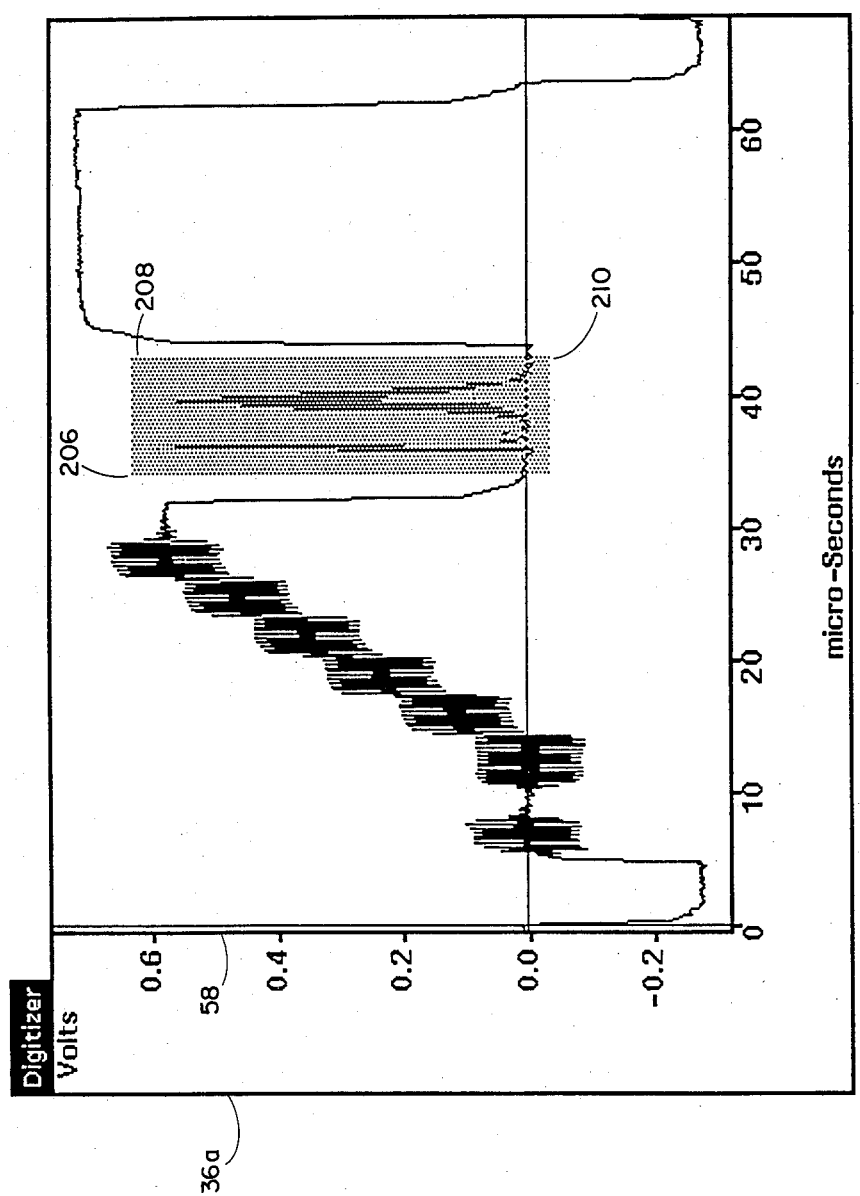
FIG. 13 shows the screen of FIG. 12 displaying a shaded rectangle which highlights the bounded region as the user drags the lower right corner of the rectangle about the screen by holding the mouse button down and moving the mouse.

Next, referring to FIG. 13, the user, by moving the mouse while holding down the pointing button, can move the lower right corner 210 to form a rectangle 208, which is highlighted or shaded on the display. When rectangle 208 encompasses the portion of waveform that is of interest to the user, the user releases the mouse button. The designated area is then stored, in terms of screen coordinate system, as a variable screenRect.

Program control is then shifted to procedure 205 of FIG. 11b and the extent of variable screenRect is compared with an arbitrary, prestored minimum value minimumZoomExtent. If the extent of the screenRect is less than this minimum value, control is passed to the "wait for button" state 132 to enable the user to designate another operation. This mechanism of checking for a very small rectangle prevents activity when the pointing button is inadvertantly pressed and immediately released, and when the user wishes to cancel a "zoom-in" operation.

Figure 14:
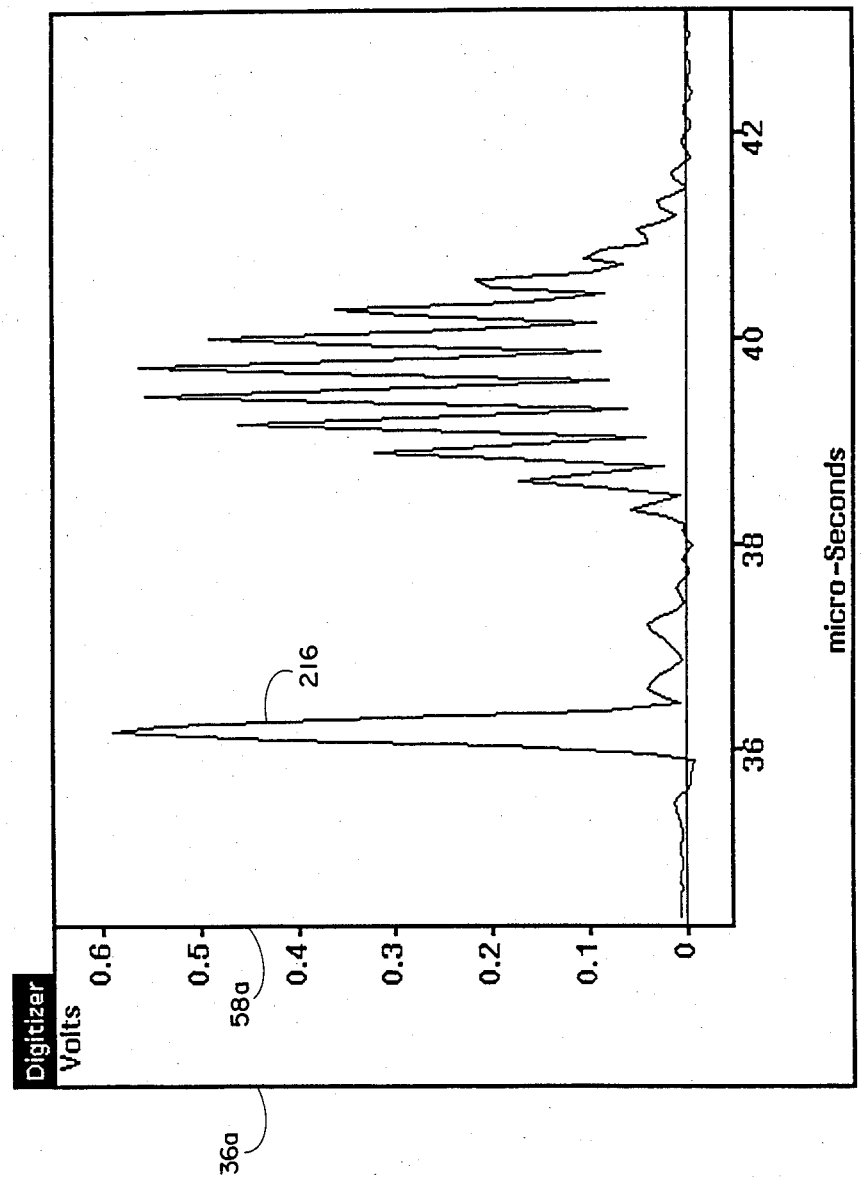
FIG. 14 shows the screen after the settings determined by the rectangle defined in FIG. 13 are calculated and sent to the digitizer and a second VITS waveform is acquired and displayed.

Operation of the "acquire data" state, as previously described, causes a new electrical signal to be acquired by the digitizer from the device under test and a new waveform 216 to be displayed on display 36a, as shown in FIG. 14, in a modified window that displays the new coordinates for acquisition window 208. Because the signal is reacquired by the digitizer, the waveform displays the signal features in substantially greater detail than the corresponding signal features for waveform 200 in FIG. 10.

Figure 15B:
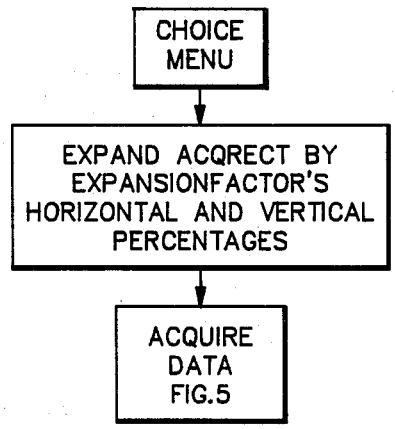
FIG. 15b is a diagram of the "zoom out" state shown in FIG. 4.
Figure 15A:
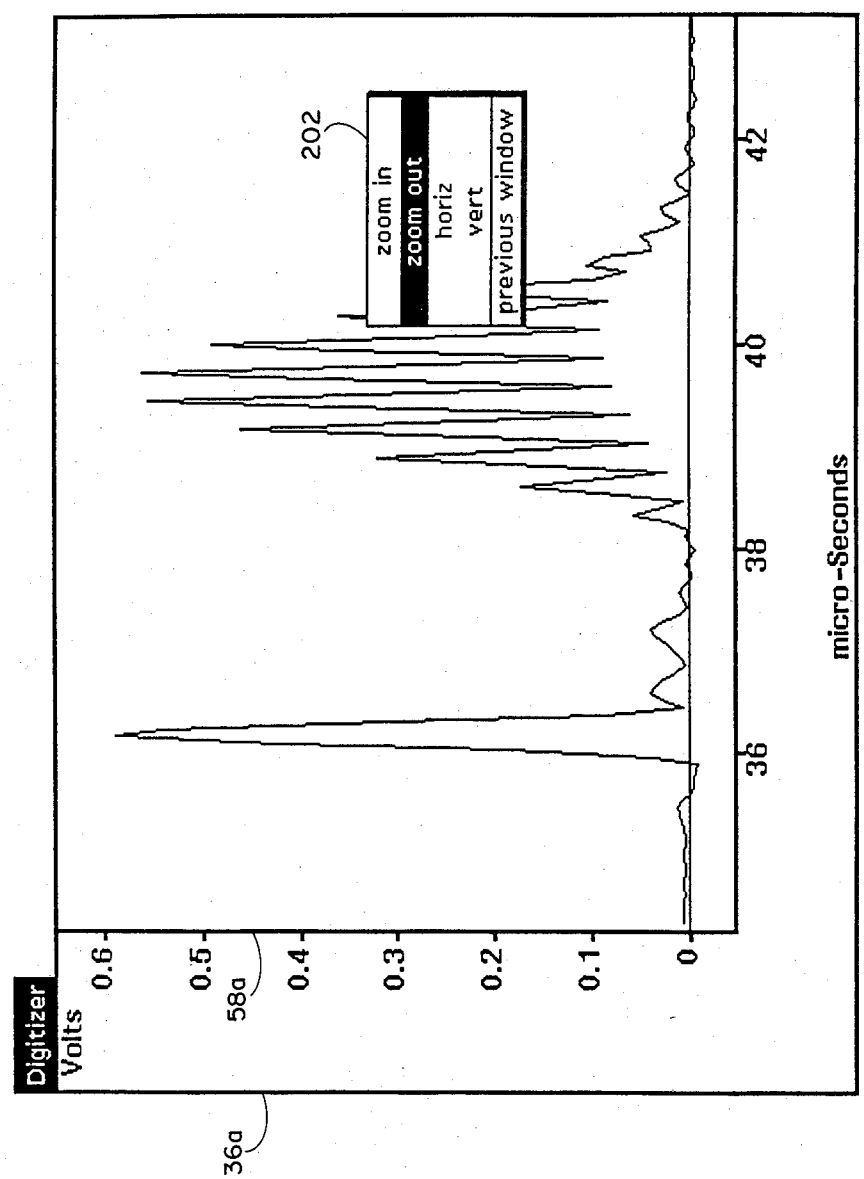
FIG. 15a shows FIG. 14 after the pop-up menue is invoked again, in which the choice is "zoom out."
Figure 16:
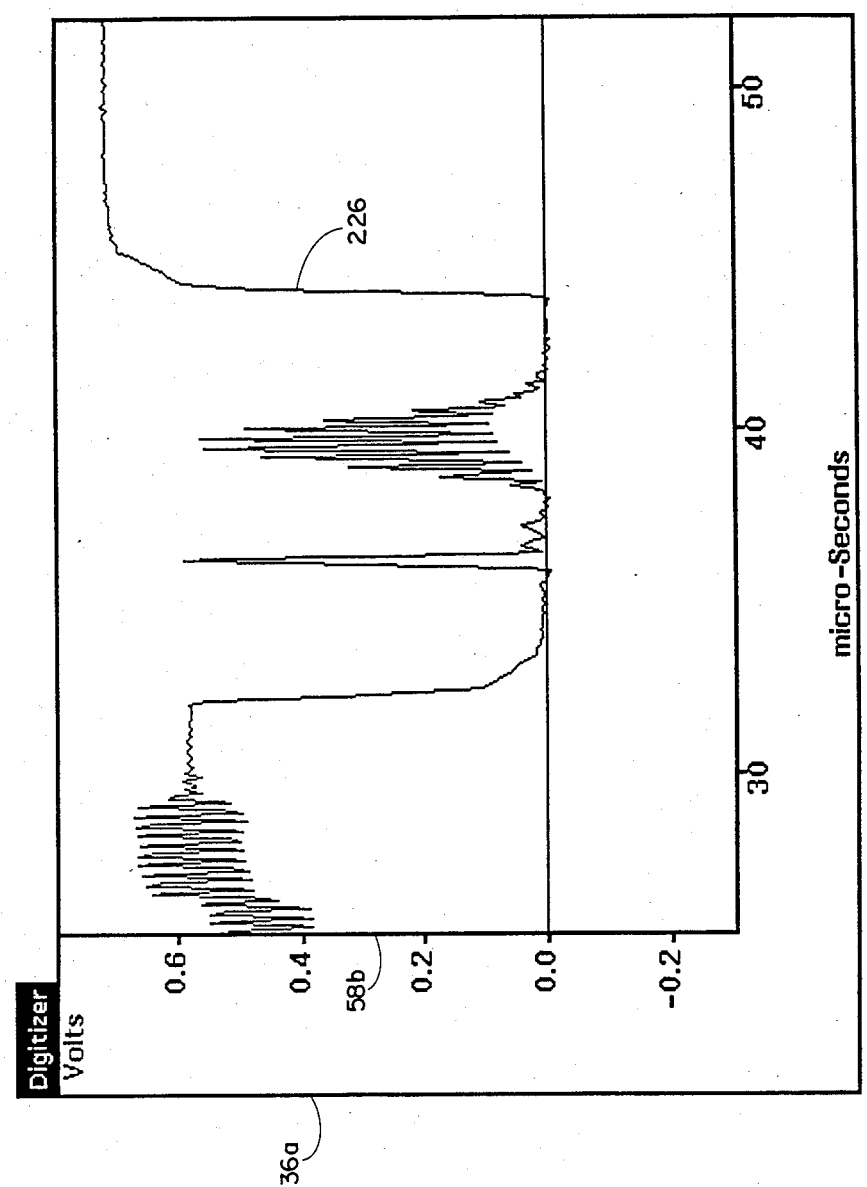
FIG. 16 shows the screen after new settings determined by the zoom out function selected in FIG. 15a are calculated, sent to the digitizer, and a third VITS waveform is acquired and displayed.

Referring to FIG. 15a, routines 106 and 116 (FIG. 4) can be actuated by the user to again invoke the choice menu 202, this time selecting the "zoom out" state. The zoom out state is illustrated in FIG. 15b. In this state, the acquisition rectangle used in the prior operation is expanded by a prestored expansion factor expressed as a percentage of the horizontal and vertical components. After the zoom out settings have been determined and transmitted to the digitizer and by the computer, the digitizer obtains a third VITS electrical signal from the device under test and returns the digitized version of such signal to the computer. The computer then displays the signal, as shown in FIG. 16, as waveform 226 on display 36a within a window 58b having a coordinate system that is modified to reflect the enlarged, zoom out acquisition window.

Figure 17A:
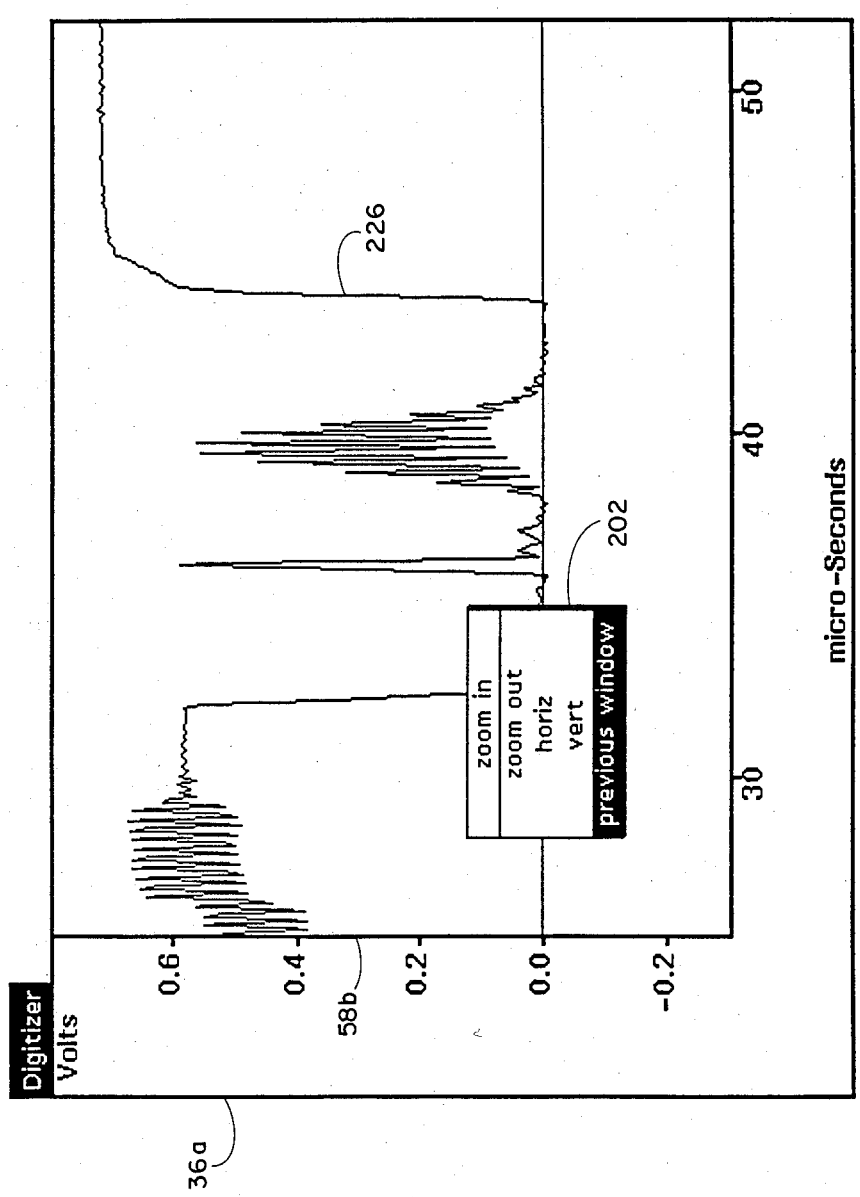
FIG. 17a shows the screen of FIG. 16 when the pop-up menu is invoked to pop the previous acquisition window off of a stack of windows and return to the "previous window."
Figure 17B:
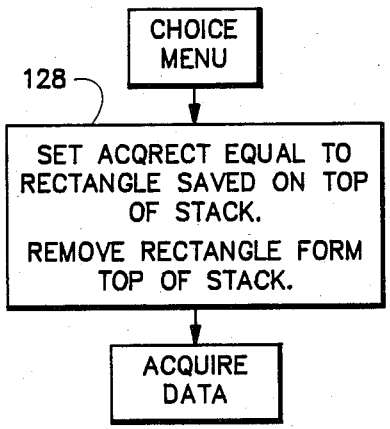
FIG. 17b is a diagram of the procedure for retrieving previous window data.
Figure 17C:
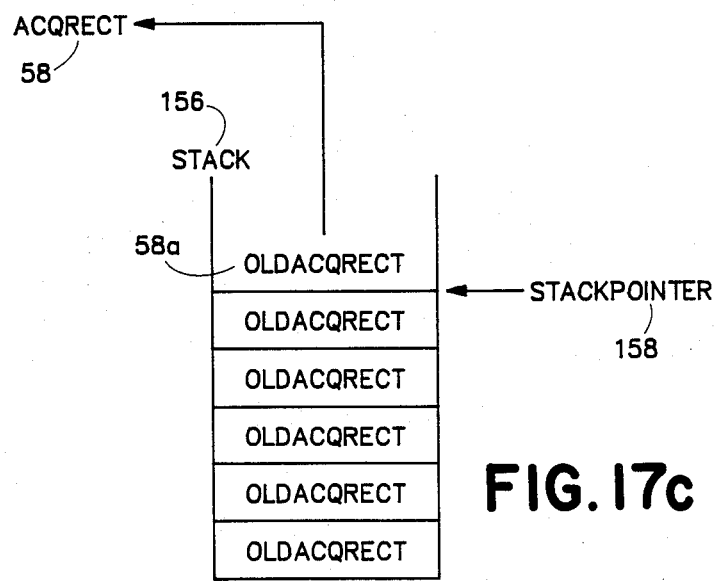
FIG. 17c shows the retrieval of a previous acquisition window from the stack of FIG. 5b.
Figure 18:
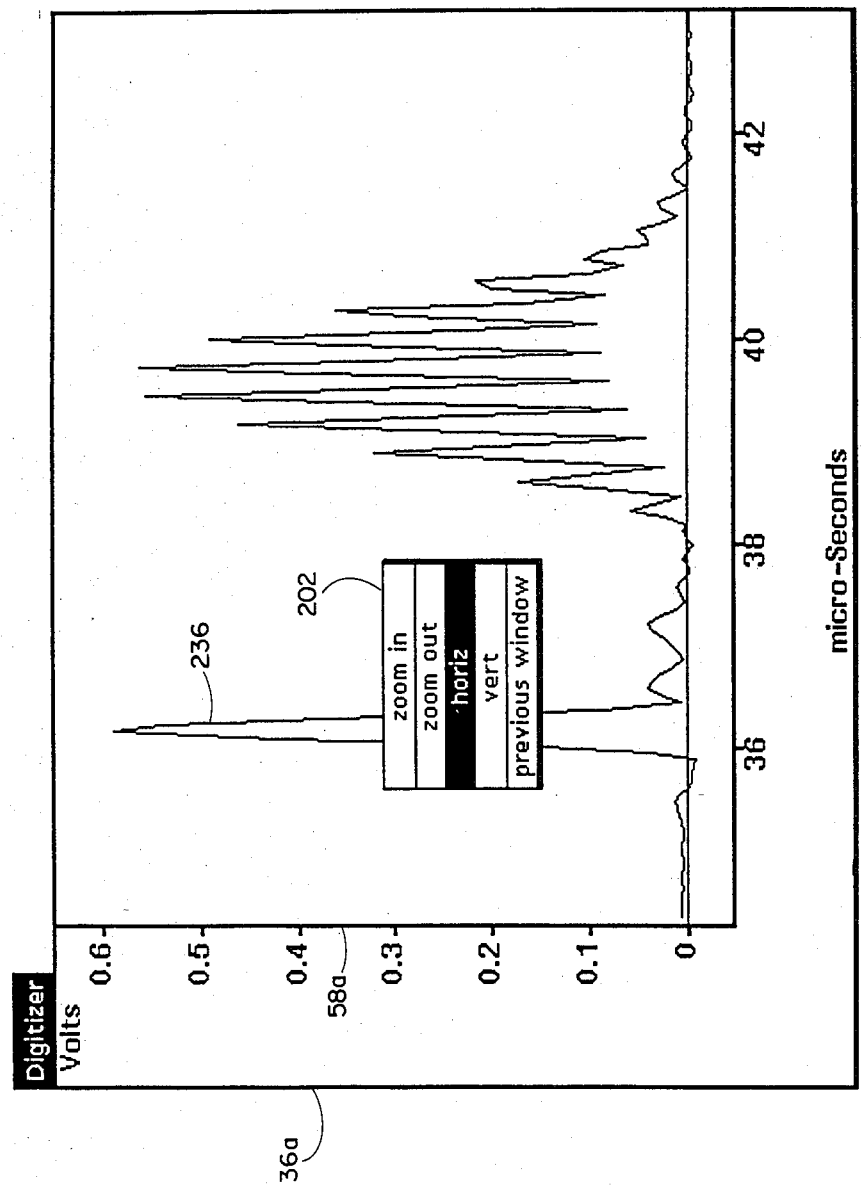
FIG. 18 shows the screen after data is again acquired from the digitizer and displayed for the signal acquisition window used in FIG. 14, with the pop-up menu again selected.

Again invoking menu 202, as shown in FIG. 17a, enables the user to designate and recall the "previous window", i.e. corresponding to window 58a of FIG. 15a. FIGS. 17b and 17c show the "previous window" procedure 128 (FIG. 4) in further detail. This procedure sets the acquisition rectangle, acqRect, equal to the last one stored in the stack, as shown in FIG. 17c. FIG. 18 shows a new waveform 236, that is returned from the device under test by the digitizer for the previous window 58a. Comparing FIG. 18 and 15a, it can be seen that essentially the same signal features are displayed but the waveforms are not necessarily identical. They can vary in both magnitude and shape and in delay position along the horizontal axis. This is because waveform 236 is not merely a replay of data previously stored for waveform 216 but is a waveform for a signal newly acquired by the digitizer within the same acquisition window. This feature of the invention enables multiple tests of the same signal features to be run repeatedly, e.g., for comparative analysis.

Figure 19:
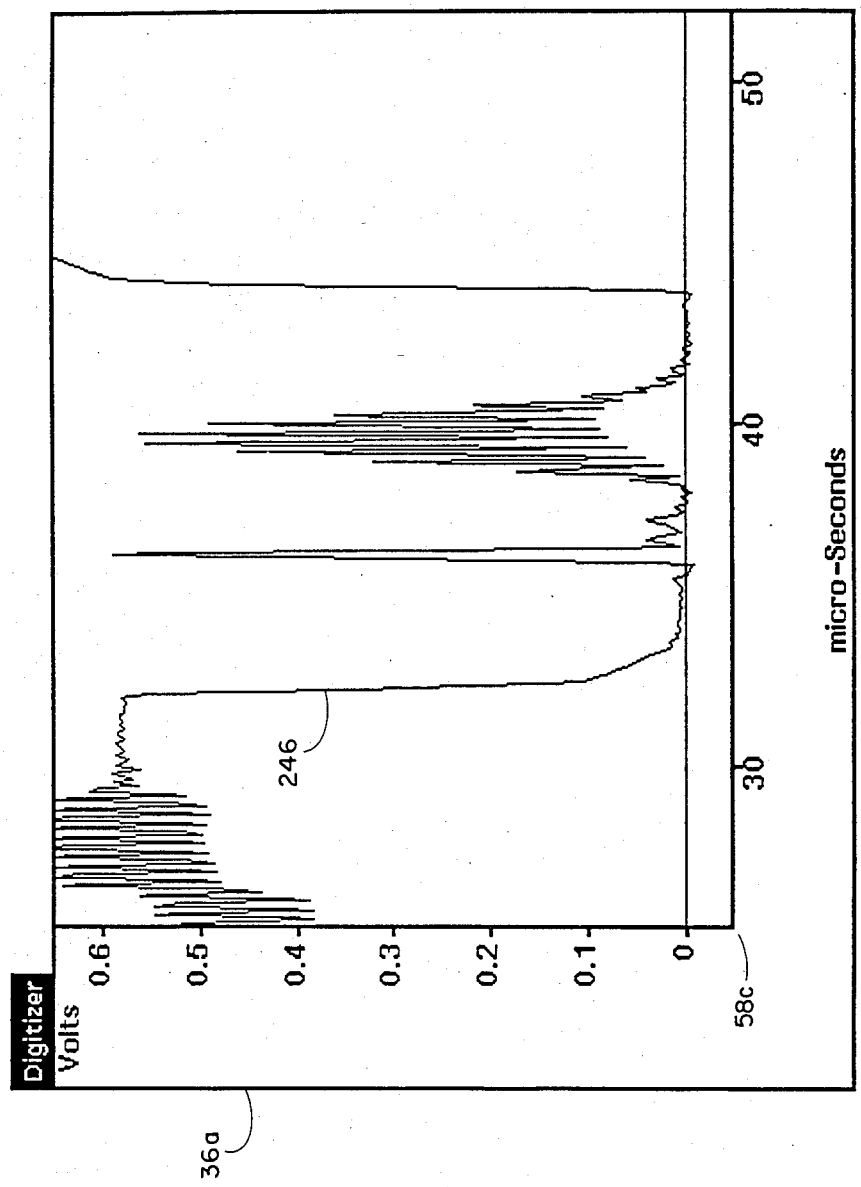
FIG. 19 shows the screen after the pop-up menu of FIG. 18 is used to select the zoom out choice "horiz," settings are calculated, and data is again acquired and displayed.

FIG. 18 also shows the choice menu 202 having been invoked and the "horiz" procedure having been selected. As shown in FIG. 19, the "horiz" procedure causes the test system to obtain a fourth test signal 246 within a signal acquisition window 58c. Window 58c has the same vertical component as window 58a, but has a horizontal component that is greatly extended in both the negative and positive directions relative to the signal feature shown in FIG. 18. Similarly, comparing FIG. 19 and FIG. 13, signal acquisition window 58c has a somewhat greater horizontal component than window 58 and has a somewhat enlarged vertical component which is, additionally, offset downward to show essentially only the positive-going features of the signal. Selection of the "vert" command in menu 202 performs essentially the same expansion as "horiz" but in the vertical dimension.

From the foregoing description, it should be apparent to those skilled in the art that other programmable, two-dimensional signal acquisition instruments, such as a spectrum analyzer, can be similarly controlled. The same principles can also be applied to the control of programmable stimulus-type instruments, as summarized below.

STIMULUS INSTRUMENT CONTROL

Stimulus-producing test instruments (those producing electrical, mechanical, acoustical, etc. signals) often have more than one setting required to define their operation. When a combination of settings dimensions can be presented as a multi-dimensional graph, the settings thus represented may be adjusted simultaneously.

This multi-dimensional control is achieved by representing the values of the various settings as a single point in the multi-dimensional space. Control over the various settings is achieved by adjusting the position of a representation of that point in the space. An example of such control is presented in the following Power Supply Control description, FIGS. 20 and 21, and APPENDIX D.

Figure 22:
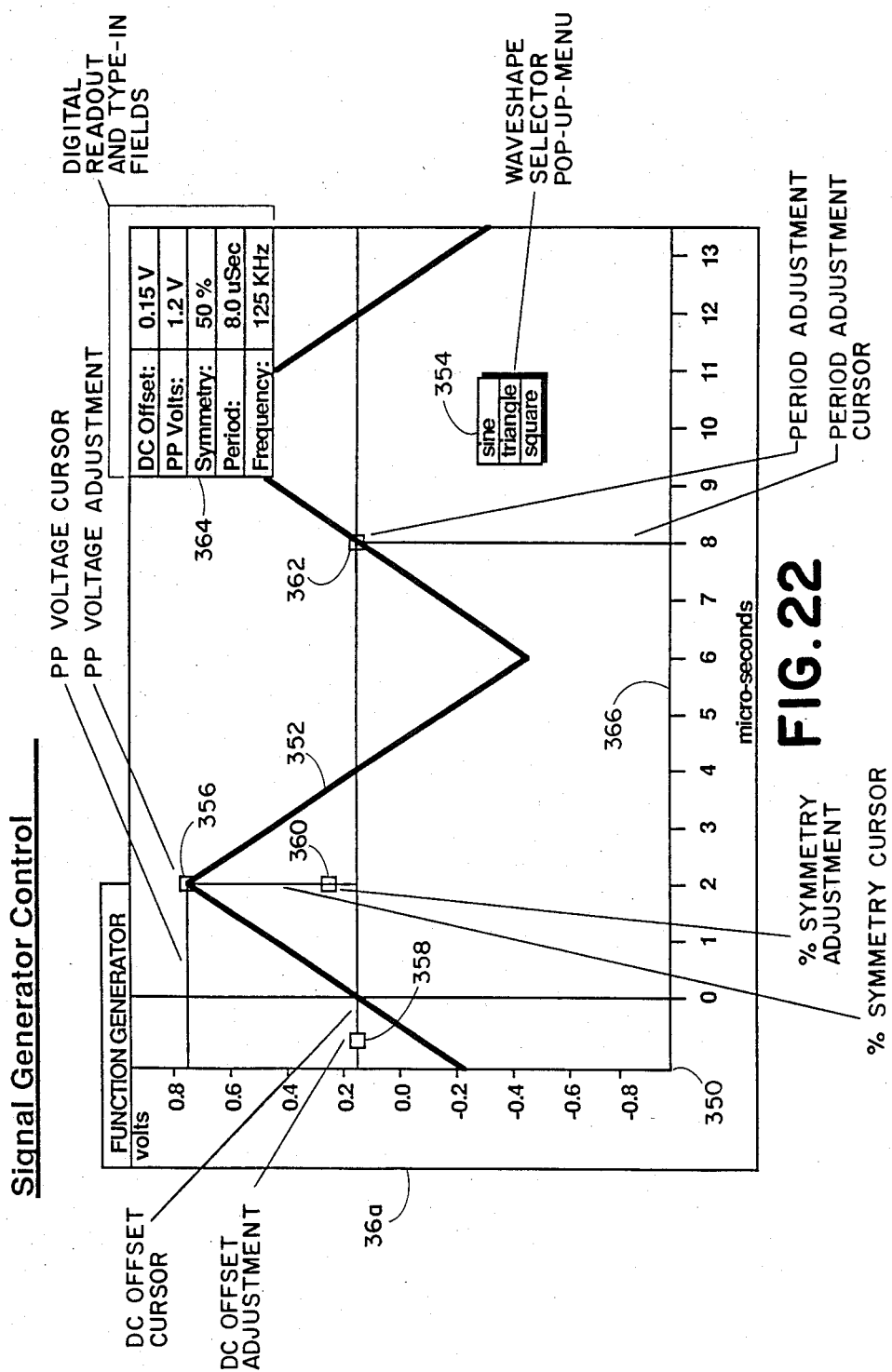
FIG. 22 shows the display screen for stimulus test instrument control of a waveform generator used in the system of FIG. 1.

Another form of graphical control involves presentation of some phototypical signal with "adjustment points" graphically depicted. Each adjustment point controls a single parameter of the stimulus signal with immediate graphical feedback of the overall effect. FIG. 22 shows application of such method of control to a programmable waveform generator.

Power Supply Control

Figure 20:
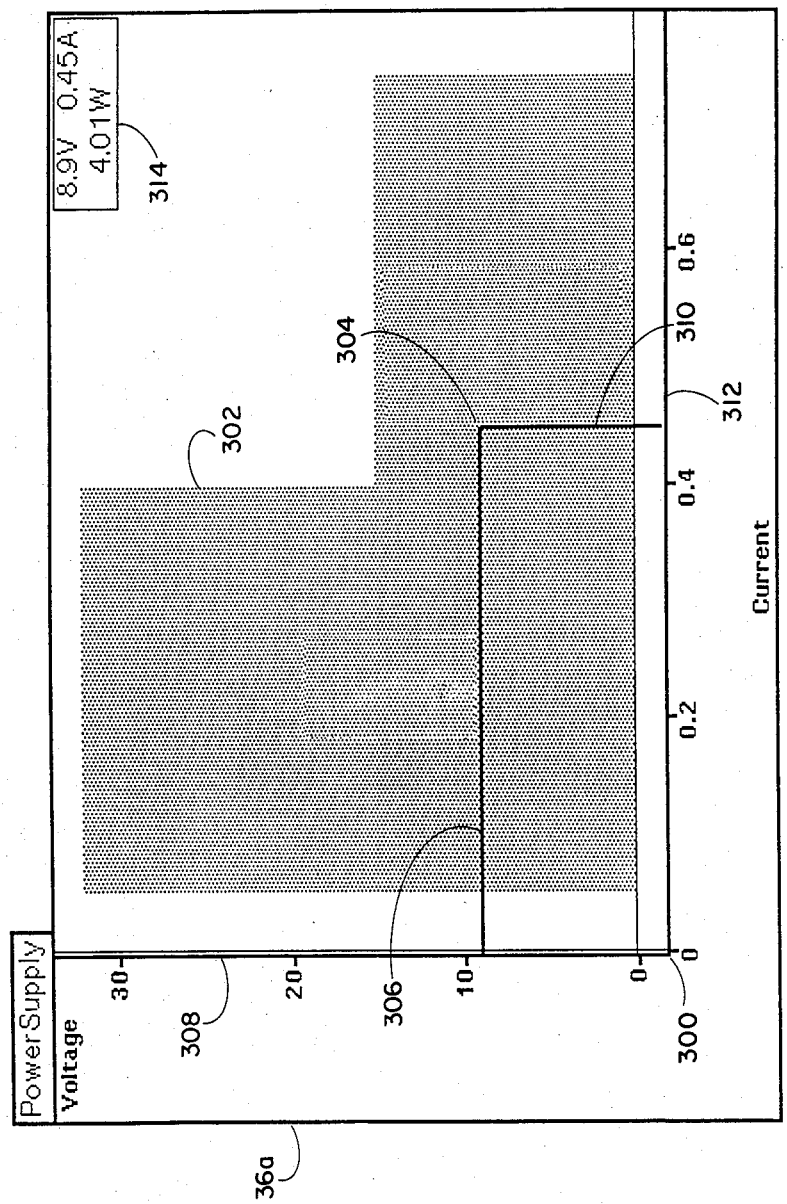
FIG. 20 shows the diaplay screen after stimulus test instrument control has been selected for a power supply used in the system of FIG. 1.

FIG. 20 demonstrates control over a power supply as an example of a stimulus-producing test instrument. Power supplies are typically controlled in terms of maximum voltage and current limits. These limits must be set by the user within the operating region for the particular power supply being used. Information about the operating region is typically provided to the user in the form of numbers defining upper and lower current and voltage capabilities of the power supply. The user must then keep these numbers in mind, or look them up, when setting the current and voltage limits of the instrument for an experiment.

In this example of the invention, these features are displayed for the positive power supply section of a Tektronix PS5010 power supply in a two-dimensional graph 300 representing current in the x dimension and voltage in the y dimension. The graph's dimensions are established to contain the power supply's operating region. (An additional 5% expansion is depicted for viewing convenience but is not necessary.) The darkened gray area 302 represents the actual operating region of the power supply. The shape of the operating region happens to be L-shaped for this particular power supply but need not be. Other models of power supply commonly have a triangularly shaped operating region.

The power supply's combined operating point 304, composed of the voltage setting and current setting operating points (i.e., positions on their respective axes), is constrained to be within this region. A horizontal line extends from the combined operating point toward the graph's voltage axis (where current is zero) to the y-axis graticule 308. A vertical line 310 extends from the combined operating point toward the graph's x axis (where voltage is zero) to the x-axis graticule 312. These lines serve to delineate the level or operating point of each power supply setting.

Settings are often combined mathematically to produce a value of additional interest. By providing a two-dimensional representation, not only can the individual dimensions be represented, but their combined effect can also be shown. In this example, the power (in watts)

provided by the instrument is the product of the voltage and current settings, and is shown by the intersection of the two lines at the combined operating point.

A digital readout 314 of voltage, current, and power is provided in the upper right corner of the graph to facilitate precise control. The placement of this readout is arbitrary. For example, the voltage readout may be displayed attached to the voltage line in some way, e.g., to the left in the graticule area. The current readout may be displayed attached to the current line, e.g., centered and to the right. The power readout might be attached to the intersection of the operating point lines.

Figure 21:
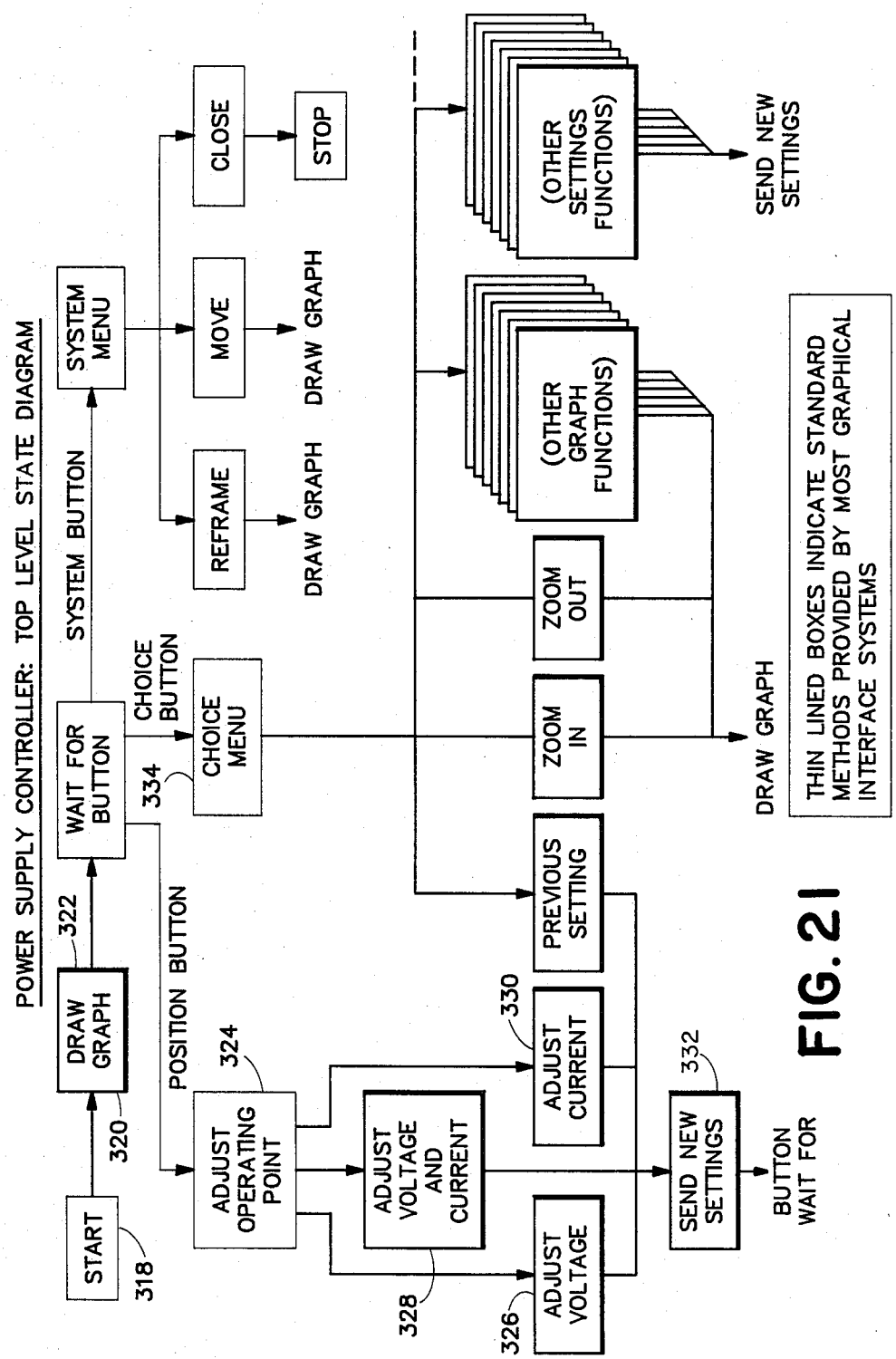
FIG. 21 is a top level state diagram for the power supply control state of FIG. 20.

User control is implemented by power supply control software diagrammed in FIG. 21 and listed in part in APPENDIX D. When this routine is invoked (START block 318), the first procedure is "draw graph" 320, as explained above. Shifting to a "wait" state 322, the user controls the power supply by moving a cursor (by activating a mouse, joystick, or other two-dimensional graphic input device) within the constraint region 302. Depressing the selector or position button, adjusts the operating point (block 324) in a manner depending on the position of the cursor. In a preferred implementation, the cursor will then jump to:

(1) the center point of the voltage line 306 (block 326),
(2) the combined operating point 304 (block 328), or
(3) the center point of the current line 310 (block 330), depending upon which was closest when the selector button was depressed. In a variation of this interface, small targets might be attached to the lines' mid-points and to the combined operating point. The user would select the desired type of interaction by moving the cursor near the appropriate target before depressing the selector button.

Once the cursor is attached to one of these points, moving the cursor will change:

(a) the position of the voltage operating point, if (1) above, without modifying the current setting
(b) the position of the combined voltage and current operating point if (2) above,
(c) the position of the current operating point, if (3) above, without modifying the voltage setting.

APPENDIX D lists the method for selecting among points 304, 306 and 310, and the method of adjustment upon selecting the combined operating point 304.

In a simplified implementation, the cursor can be made to always jump immediately to the combined operating point, thus denying independent setting of voltage or current operating points.

Once the desired settings are established, they are converted to power supply control commands by routine 332. Three ways of dealing with the resulting power supply settings are reasonable:

(1) sending the voltage and current operating points to the power supply as a user slides the lines within the display,
(2) sending the operating points only after the user has positioned the new combined operating point, or
(3) holding the operating points for later setting by some other part of a larger instrument system.

None of these modes is preferred over the other, except with respect to a specific application or instrument system implementation. As used in the above-referenced BLOCK DIAGRAM EDITOR SYSTEM, the third alternative is preferred for making initial settings, followed by use of the second alternative to enable interactive control during execution of an experiment.

A choice menu (block 334) may also be implemented to facilitate operation of the power supply. As shown in FIG. 21, choices can include "zooming in" on a user-designated subsection of the operating region to provide finer placement of the operating points and, thus, finer control. A "zoom out" function can be provided to undo the effect of a "zoom in" function. A "previous setting" choice can restore the previous combined operating point from a stack of operating points saved as settings were adjusted. A "power on" and a "power off" choice may be provided for turning the supply's output switch on and off. Further choice menu items may be implemented for directly setting operating points for specific applications (e.g., for logic families: "TTL" (5V, maximum current); "ECL" (−5.2V, maximum current)).

Signal Generator Control

Another form of graphical control involves presentation of some prototypical signal with "setting points" graphically depicted. Each adjustment point controls a single operating point of the stimulus signal in two dimensions with immediate graphical feedback of the overall effect. This form of control is to be distinguished from systems, the Macintosh music systems, for example, which use "sliders" to establish setting values (one dimension each) by positioning each slider along a graticule and adopting the position of each as one parameter of a waveform to be generated. The waveform, however, is not displayed and graphically manipulated by movement of the sliders in such systems. This form of graphical control also differs from a known cursor tracking system for "drawing" a waveform to be "played" by the system. The latter system converts screen points of a waveform drawn by the user into amplitude samples and passes the samples through a digital-to-analog converter to produce an analog signal closely approximating the user-drawn waveform.

FIG. 22 shows a user interface to a signal generator (such as the Tektronix FG5010). A two-dimensional graph 350 displays a waveform 352. A pop-up-menu 354 is used to specify which waveform type (sine, square, or triangle) is to be generated (this selection is "digital" in nature: only one of a set of choices is available, with no intermediate forms). In the displayed example, the "triangle" waveform has been chosen, and a graphical representation of the waveform is displayed with rectangular targets over points representative of the waveform's operating points: target 356 for peak-to-peak amplitude; target 358 for dc offset; target 360 for percent waveform symmetry; and target 362 for period. In this example, the operating points are adjusted by moving a cursor ito (or near) a particular target, depressing a selection button on the mouse to select the nearest target and, while the button is depressed, moving the mouse to move the selected target. As the target is moved, the displayed representation of the signal generator's output waveform is adjusted to illustrate the change. The actual operating point values may be displayed in a read-out window 364. As in the power supply example, the operating points are constrained by the design of the instrument. In this example, adjustment simply stops when these limits are reached (i.e., continued movement of the mouse produces no effect).

When an operating point, such as frequency, may be adjusted over several orders of magnitude (e.g., 0.002 Hz to 20 MHz in the FG5010), two different techniques are used to illustrate the effect on the displayed waveform. Small or slow movements cause the signal representation to change, allowing the operating point to be established with great precision. When large or fast movements of the positioning device are detected, the period graticule 366 adjusts, rather than the signal representation. By pushing the operating point target, the user causes the graticule to adjust, achieving the same effect: the representation of the output waveform is properly displayed with respect to the graph.

Having illustrated and described the principles of my invention in a preferred embodiment with an operative example thereof, it will be appreciated by those skilled in the art that the invention may be modified in arrangement and detail without departing from such principles. I claim all modifications coming within the spirit and scope of the following claims.

APPENDIX A: Signal Viewing Variables

These are the variables used in the operation of signal viewing interface to a digitizer.

Interface defining and operating variables defaultAcqRect
    Rectangle
        origin x: 0.0  *start time*
        origin y: -5.0  *lowest voltage*
        corner x: 0.01  *end time*
        corner y: 5.0  *hightest voltage* screenRect
    Rectangle from 'zoom in' function
        origin x: 0.0  *corresponds to start time*
        origin y: -5.0  *corresponds to lowest voltage*
        corner x: 0.01  *corresponds to end time*
        corner y: 5.0  *corresponds to hightest voltage* displayTransformation
    WindowingTransformation
        scale: *scale factors for x and y dimensions*
        translation: *offset factors for x and y dimensions* acqRect
    Rectangle
        origin x: *user-specified start time*
        origin y: *user-specified lowest voltage*
        corner x: *user-specified end time*
        corner y: *user-specified hightest voltage* zoomOutFactor
    Point
        x: *factor by which to expand acqRect horizontally*
        y: *factor by which to expand acqRect vertically* minZoomRect
    Rectangle
        origin: 0@0
        extent: 10@10

*Minimum size, in screen units, of rectangle for 'zooming in.'*
    *These coordinates are entirely arbitrary and should be dictated*
    *by the application area addressed.*

| Digitizer defining variables | |
|---|---|
| vTables | Collection<br>*Contains following four variables which define a digitizer for vertical settings* |
| rangeTable | Collection<br>*Permissible voltage range settings arranged from smallest to largest* |
| minOffset | Number<br>*Lowest offset (as percentage of range) setting allowed* |
| maxOffset | Number<br>*Highest offset (as percentage of range) setting allowed* |
| offsetRes | Number<br>*Resolution of offset setting* |
| hTables | Collection<br>*Contains following four variables which define a digitizer for horizontal settings* |
| sampleIntervalTable | Collection<br>*Permissible sample interval settings arranged from smallest to largest* |
| minDelay | Number<br>*Lowest delay setting allowed* |
| maxDelay | Number<br>*Highest delay setting allowed* |
| maxSamples | Number<br>*Maximum value of samples that may be acquired.* |

| Calculated digitizer settings | |
|---|---|
| range | Number<br>*an element from rangeTable in volts peak-to-peak* |
| offset | Number<br>*in ± percent of range* |
| sampleInterval | Number<br>*an element from SampleRateTable, in seconds* |
| delay | Number<br>*in samples* |
| samples | Number<br>*number of samples to be acquired* |

APPENDIX B

This is the method (written in the Smalltalk-80 programming language) for caluclating the vertical settings to be sent to a digitizer.

```
verticalSettings: acqRect tables: vTables
"This method calculates range and offset settings for a digitizer defined in
vTables for a user-specified acquisition rectangle, acqRect."

| rangeTable offsetMin offsetMax i range offset result offsetRes |

"vTables is a dictionary with 4 entries. It defines a digitizer for establishing vertical settings.
The table's entries are:

rangeTable - a collection of vertical ranges, ordered smallest to largest
        offsetMin ← minimum value for offset
        offsetMax ← maximum value for offset
        offsetRes ← resolution with which offset may be specified.

The following temporary variables are unpacked from vTables for clarity."

rangeTable ← vTables at: 1.
offsetMin ← vTables at: 2.
offsetMax ← vTables at: 3.
offsetRes ← vTables at: 4.

i ← 1.          "a pointer into rangeTable"

[               "Select a range from rangeTable."

range ← rangeTable at: i.

"Calculate an offset, as a percentage of the current range, such that the offset
        is the center of the acqRect's vertical component or the minimum or maximum
        allowed offset value."

offset ← (((acqRect top + acqRect bottom) / 2.0) / range * 100.0) truncateTo: offsetRes.
    offset ← (offsetMin max: offset) min: offsetMax.

"Test to determine whether:
                1) the rangeTable has been exhausted, or
                2) the range and offset settings can be combined to bracket the
                   acqRect's vertical component."

i >= rangeTable size
    or: [(acqRect top) >= ((range * (offset / 100.0)) - (range / 2.0))
        and: [(acqRect bottom) <= ((range * (offset / 100.0)) + (range / 2.0))]]]
whileFalse: [i ← i + 1].

"Transcript
        show: ((range * (offset / 100.0)) - (range / 2.0)) printString;tab;tab;
        show: ((range * (offset / 100.0)) + (range / 2.0)) printString;cr;
        tab;show: 'RANGE: ', range printString;cr;
        tab;show: 'OFFSET: ', offset printString;cr;cr."

result ← OrderedCollection new: 2.
result addLast: range;
       addLast: offset.
↑ result
```

APPENDIX C

This is the method (written in the Smalltalk-80 programming language) for caluclating the horizontal settings to be sent to a digitizer.

horizontalSettings: acqRect tables: hTables

*"This method calculates sampleInterval, delay and samples settings for a digitizer defined in hTables for a user-specified acquisition rectangle, acqRect."*

| sampleIntervalTable minDelay maxDelay maxSamples i sampleInterval delay samples result |

*"hTables is a collection with four entries. It defines a digitizer for establishing horizontal settings. The table's entries are:*

*sampleIntervalTable - a collection of available sample rates, ordered from shortest to longest,*
*minDelay - the minimum delay value (with respect to a trigger event),*
*maxDelay - the maximum delay value,*
*maxSamples - the maximum number of samples that may be acquired.*

*The following temporary variables are unpacked from hTables for clarity."* sampleIntervalTable ← hTables at: 1.
minDelay ← hTables at: 2.
maxDelay ← hTables at: 3.
maxSamples ← hTables at: 4.

i ← 1. *"a pointer into the sampleIntervalTable."*

[
    *"Select a sampling rate, sampleInterval, from sampleIntervalTable."* sampleInterval ← sampleIntervalTable at: i.

*"Calculate delay as the number of sampling intervals (after a trigger event) to wait before sampling. Delay must obey the restriction: minDelay <= delay <= maxDelay."* delay ← (acqRect left / sampleInterval) floor asFloat.*"use next lowest integer number of sample times"*
    delay ← (minDelay max: delay) min: maxDelay.

*"Calculate the number of sample points, samples, from the first sampling time to the sampling point at or 1 past the latest (or right) edge of the acquisition window (the value is 1 greater than the number of sampling intervals). Samples must obey the restriction: samples <= maxSamples."* samples ← ((acqRect right - (delay * sampleInterval)) / sampleInterval) ceiling asFloat + 1.0.
    samples ← samples min: maxSamples.

*"Test to determine whether:*
    *1) the sampleIntervalTable has been exhausted, or*
    *2) the acquisition rectangle's latest (or right) edge is less than or equal to the delay time plus the digitizer window's width (the acquisition window's earliest (or left) edge is guaranteed to be within the digitizer's window by the delay calculation)."* i >= sampleIntervalTable size
    or: [acqRect right <= ((delay * sampleInterval) + ((samples - 1.0) * sampleInterval))]
]
whileFalse: [ i ← i + 1 ].

*"Return a collection with sampleInterval, delay, and samples."* result ← OrderedCollection new: 3.
result addLast: sampleInterval;
    addLast: delay;
    addLast: samples.
↑ result

APPENDIX D

These are the key Smalltalk-80 methods for graphically controlling a power supply (FIGs. 20 and 21).

---

This is the workspace program for creating, defining, and opening a view for controlling a power supply.

```
ps ← PowerSupply new.
ps constraints: (OrderedCollection
    with: (0.05@0.0 corner: 0.4@32.0)
    with: (0.4@0.0 corner: 0.75@15.0)).

PowerSupplyView openOn: ps
```

---

This method dispatches control to one of three operating point procedures depending upon the location of the system cursor when the operating (red) button is pressed.

```
PowerSupplyController methodsFor: 'interactive settings' redButtonActivity

"Decide which operating point to adjust.
    Select the operating point nearest the default cursor when the button was pushed."

| myPosition cursorPosition d1 d2 d3 |

"Get the default cursor position and my combined operating point in terms of
    screen coordinates."

cursorPosition ← Sensor cursorPoint.
    myPosition ← (view displayTransformation applyTo: model asPoint) rounded.

"Find distances from default cursor position to:
        x operating point cursor mid-point
        y operating point cursor mid-point
        combined operating point."

d1 ← cursorPosition dist: ((view displayBox left) @ (myPosition y + myPosition / 2.0)).
    d2 ← cursorPosition dist: ((myPosition x) @ (view displayBox bottom + myPosition / 2.0)).
    d3 ← cursorPosition dist: myPosition.

"Find shortest distance and perform appropriate operation."

d1 < d2
        ifTrue: [d1 < d3
            ifTrue: [self yPointOperation]
            ifFalse: [self combinedPointOperation]]
        ifFalse: [d2 < d3
            ifTrue: [self xPointOperation]
            ifFalse: [self combinedPointOperation]]
```

This method provides for the interactive adjustment of the combined operating point.

combinedPointOperation: view

*"Displays x cursor from point to graticule which track the sensor point until the redButtonis clicked."*

|screenPt oldScreenPt screenConstraints oldRect a b oldXCursor oldYCursor |

*"Get combined operating point in screen coordinates."* screenPt ← oldScreenPt ← view displayTransform: model asPoint.

*"Blank out cursor and move it to the combined operating point."*

Cursor blank show.
Sensor cursorPoint: screenPt.

*"Make forms for the x and y cursors."* oldXCursor ← (Form
    extent: ((xCursor translateBy: oldScreenPt)
        intersect: view insetDisplayBox) extent) black.
oldYCursor ← (Form
    extent: ((yCursor translateBy: oldScreenPt)
        intersect: view insetDisplayBox) extent) black.

*"screenPt is guaranteed to be within the constraints. Convert constraint rectangles into screen coordinate system, and find out which one contains the operating point (screenPt)."* screenConstraints ← self screenConstraints: view displayTransformation.

oldRect ← screenConstraints detect: [:x | x containsPoint: screenPt]
        ifNone: [self error: 'self not within constraints'].

*"While the red button is pressed, adjust the combined operating point."*

[Sensor redButtonPressed] whileTrue:
    [screenPt ← Sensor cursorPoint.
    screenPt = oldScreenPt
        ifFalse: [ *"A new screen point (cursor has moved): find out if current constraint (oldRect) still contains the point."*

(oldRect containsPoint: screenPt)
            ifFalse: [ *"If not, find out if any other constraint contains the point, and make it the new curent constraint."* oldRect ← screenConstraints
                detect: [:x | x containsPoint: screenPt]
                ifNone: [ *"If not, adjust the cursor point back into the current constaint (oldRect). This makes the cursor follow edges."* screenPt ← screenPt + ((screenPt extent: 1 @ 1)
                    amountToTranslateWithin: oldRect).
                Sensor cursorPoint: screenPt.
                oldRect]].

*"Animate the x and y cursors by building cursors for the new locations and asking the old cursors to move the new cursors to the new locations restoring the old* backgrounds (a variant of a standard Smalltalk-80 method. yBg and xBg are instance
variables instantiated in display method: they contain the background under the
operating point cursors."

```
yBg ← oldYCursor moveNewForm: (oldYCursor ←
              ((Form extent: (a ← ((yCursor translateBy: screenPt)
              intersect: view insetDisplayBox)) extent) black))
       to: a origin
       restoring: yBg.
xBg ← oldXCursor moveNewForm: (oldXCursor ←
              ((Form extent: (a ← ((xCursor translateBy: screenPt)
              intersect: view insetDisplayBox)) extent) black))
       to: a origin
       restoring: xBg.
```

"Paint up the new digital readout."

```
self updateReadout: screenPt.
oldScreenPt ← screenPt]].
```

"Button is released. Establish new combined operating point, and show the normal cursor"

```
model newSettingPoint: (view inverseDisplayTransform: screenPt).
Cursor normal show
```

I claim:
1. A method for controlling a test instrument including a first processor and having a predetermined set of programmable control settings, including:
   providing a computer including a second processor and having external communications means for transmitting control setting commands from the second processor to the first processor, user input means for a user to enter data to the computer, and a memory;
   storing, in the computer memory, data defining a transformation function of the test instrument for inversely transforming a generic output for the instrument into a generalized set of said control setting commands for controlling operation of the instrument;
   entering, in the computer, data that defines a user-specified output for the instrument;
   inversely transforming the user-specified output in accordance with the transformation function to produce, in the second processor, a specific set of said control setting commands; and
   transmitting the specific set of control setting commands to the first processor to operate the test instrument in accordance with specific control settings that cause it to produce an output replicating the user-specified output.

2. A method according to claim 1 in which the test instrument provides said output in two dimensions and the computer includes graphical display means for displaying two-dimensional data in a graphical coordinate system, the method further including:
   displaying a representation of said output in a two-dimensional definition window;
   operating the user input means to specify a point relative to the output displayed within said window and thereby graphically designate a selected feature of the user-specified output for the instrument in said graphical coordinate system;
   transforming the user-specified point from said graphical coordinate system to define an operating point in a coordinate system of operation of the test instrument; and
   producing said specific set of control setting commands to operate the test instrument in accordance with said operating point for transmission to the test instrument processor.

3. A method according to claim 2 in which the test instrument is a stimulus-type test instrument for generating a test signal having signal features in at least two dimensions, the method further including graphically displaying and attaching the user-specified point to the selected feature of the output and moving the representation of the output as the user actuates the user input means to move said point so as to modify the representation of the output displayed to the user.

4. A method according to claim 3 in which the user-specified point is attached to two of said features to define a combined operating point of the instrument, movement of the user-specified point moving both of the features and the operating point associated with each feature simultaneously.

5. A method according to claim 2 in which the the test instrument produces said output solely within a constrained operating region, the method further including:
   storing, as a part of said transformation function, data defining the constrained operating region for said output;

comparing said operating point to the constrained operating region; and producing said specific set of control settings in accordance with said operating point only if the operating point is within said region.

6. A method according to claim 5 in which a modified set of control settings is produced if the operating point is outside said region, production of said modified set including determining a modified operating point within said region that is nearest the operating point in the dimension of the designated feature and producing the modified set of control settings in accordance with the modified operating point.

7. A method according to claim 5 in which the computer and graphical display means are responsive to user actuation of the user input means to specify a location for said point, the method further including interactively displaying and positioning the user-specified point within the two-dimensional definition window in a location determined by the user and moving the designated feature of the displayed output as the user actuates the user input means to position said point.

8. A method according to claim 2 in which the test instrument is a test instrument for detecting a test signal in a device under test and transmitting the detected signal to the computer, the method including:

detecting a portion of the test signal within a first, two-dimensional signal acquisition window;

transmitting the detected portion of the test signal to the computer;

displaying a two-dimensional representation of the detected portion of the test signal to the user within said definition window;

operating the user input means to specify at least two points relative to the displayed output to graphically define a second, two-dimensional signal acquisition window;

inversely transforming the points defining the second acquisition window in accordance with the stored transformation function of the instrument to produce a modified specific set of control setting commands for acquiring a modified user-specified output in accordance with said two points; and transmitting the modified specific set of control setting commands to the test instrument to operate it in accordance with the modified control settings to cause it to produce a modified output replicating the modified user-specified output designated by said two points.

9. A method according to claim 8 including scaling the modified output to the dimensions of the definition window and displaying a representation of the modified output therein.

10. A method according to claim 8 including:

storing each acquisition window in turn;

entering, in the computer, data that defines a user-specified command for recalling a selected one of the stored acquisition windows; and responsive to the recalling command, recalling the selected stored acquisition window and reproducing therefor a set of control setting commands and retransmitting same to the test instrument to operate it again to produce a second output replicating the user-specified output for the recalled acquisition window.

11. A method for controlling a programmable test instrument having a first processor and which operates within a constrained operating region to acquire a test signal within a two-dimensional signal acquisition window relative to an input trigger event, the method comprising:

providing a computer having a second processor, external communications means for receiving and transmitting data between the processors, a display means for displaying data from the computer to a user, and user input means for the user to enter data to the computer, and a memory;

programming the computer processor with interactive graphics software for displaying data graphically and windowing software for displaying data within a two-dimensional definition window on the display means;

entering, in the computer, a graphical specification of a desired signal acquisition window and displaying same on the display means;

storing display coordinates of the desired window in the memory;

transforming the display coordinates in the second processor to two-dimensional signal feature coordinates whereby an acquisition window is defined by start and end values in a first dimension and by lowest and highest values in a second dimension;

storing a transformation function of the test instrument including a set of commands for programming control settings of the instrument and data defining the constrained operating region of the instrument in at least one dimension;

comparing the signal feature coordinates in at least said one dimension to the constrained operating region;

producing a set of control settings in accordance with said signal feature coordinates if the signal feature coordinates in said one dimension are within said region; and generating and transmitting to the test instrument processor selected ones of said set of commands including the control settings for the signal feature coordinates, thereby causing the test instrument to acquire signal data from a device under test in accordance with a signal acquisition window determined by the desired signal acquisition window.

12. A method according to claim 11 in which the constrained operating region in defined in the first dimension as having a maximum length and a minimum and a maximum offset of the start value of the acquisition window from said input trigger event and the comparing step includes determining whether the start value of the acquisition window is between the minimum and maximum offsets and whether the end value is less than the start value plus the difference between the end and start values, such difference being no greater than said maximum length.

13. A method according to claim 11 in which the constrained operating region is defined in the second dimension as having a maximum range and a maximum offset of the range of the acquisition window from an origin in said second dimension and the comparing step includes determining whether an offset of the acquisition window from said origin is less than the maximum offset and whether the highest and lowest values of the acquisition window in the second dimension fall between endpoints of said range positioned at said offset.

14. A method according to claim 11 in which:

the constrained operating region is defined in the first dimension as having a maximum length and a minimum and a maximum offset of the start value of the acquisition window from said input trigger event and is defined in the second dimension as having a maximum range and a maximum offset of the range of the acquisition window from an origin in said second dimension; and the comparing step includes determining, for the first dimension, whether the start value of the acquisition window is between the minimum and maximum offsets and whether the end value is less than the start value plus the difference between the end and start values, such difference being no greater than said maximum length, and determining, for the second dimension, whether an offset of the acquisition window from said origin is less than the maximum offset and whether the highest and lowest values of the acquisition window in the second dimension fall between endpoints of said range positioned at said offset. event, in which the selecting step includes choosing the highest one of the set of sample rates such that:

delay is at least as great as the minimum delay and no greater than the maximum delay;

the number of samples required at such rate between the start and end values is no greater than the maximum number of samples allowed;

the start value is at least as great as the delay divided by sample rate; and the end value is no greater than the delay plus the number of samples required divided by sample rate.

15. A method according to claim 11 in which the first dimension represents time relative to said input trigger event; the storing, comparing and producing steps including:

selecting a sample interval and number of samples whose product approximates a difference between the end and start values of the acquisition window and a delay from the input trigger event such that a first and a last of said number of samples substantially coincide with said start and end values, respectively; and controlling operation of the test instrument in the first dimension in accordance with the selected sample interval, number of samples and delay.

16. A method according to claim 15, including storing parameters defining the constrained operating region first dimension, including a set of sampling rates, a maximum number of samples allowed, and a maximum and minimum delay from said input trigger.

17. A method according to claim 11, in which the second dimension represents amplitude relative to a predetermined origin; the storing, comparing and producing steps including:

storing parameters which define a set of ranges of values in the second dimension and a minimum and a maximum offset that can be added to each range in the set;

selecting from said set a range of values in the second dimension that is greater than the difference between the highest and lowest values of the display coordinates of the desired window in the second dimension and an offset of a center point of the selected range from the origin in the second dimension such that the lowest and highest values of the range are positioned between or coincide with a lowest and a highest setting, respectively, allowed in the second dimension by the test instrument; and controlling the test instrument in accordance with the selected range and offset, thereby causing the test instrument to acquire signal data from a device under test in accordance with a signal acquisition window determined by the desired signal acquisition window.

18. A method of according claim 17 in which the maximum and minimum offsets are stored as percentages of offset allowed each range and the selecting step includes choosing the smallest one of the stored range settings and an offset for operation of the test instrument in the second dimension such that:

(1) offset is the minimum of
  (a) the maximum percentage offset allowed, or
  (b) the maximum of either
    (i) the minimum percentage offset allowed, or
    (ii) the percentage of a midpoint between the highest and lowest values of the acquisition rectangle divided by the selected range; and (2) offset multiplied by the selected range plus the selected range divided by two is at least as great as the lowest value of the acquisition rectangle; and (3) offset multiplied by the selected range less the selected range divided by two is no greater than the highest value of the acquisition rectangle.

19. A user-interactive, graphically-controllable electronic test system, comprising:

a computer having external communications means for receiving and transmitting data, a display means for displaying data from the computer to a user, and user input means for the user to enter data to the computer;

programmable test instrument means including a processor responsive to computer-generated commands for providing an output function defined in at least two dimensions; and instrument control means in the computer for generating control setting commands for transmission to the test instrument means;

the computer including:
  interactive graphics software means for displaying data graphically on the display means;
  windowing software means for displaying data within a two-dimensional definition window on the display means;
  means responsive to the user input means for entering and two-dimensionally positioning a user-defined point on the display means;

means for converting the user-defined point from coordinates of the display means into two-dimensional signal feature coordinates of the test instrument means; and means for inputting said signal feature coordinates to the instrument control means to cause it to actuate generation of control setting commands embodying the signal feature coordinates and transmission thereof to the test instrument means to cause it to provide said output function in accordance with said user-defined point.

20. A system according to claim 19 in which;

the test instrument means is a signal-detecting instrument for acquiring signal data in two dimensions from a device under test and returning said data to the computer;

the computer includes means for actuating the graphics and windowing software means to display a two-dimensional representation of the data in the definition window;

the means responsive to the user input means includes means for entering and positioning two of said points to define a signal acquisition window on the display means; and the means for converting is adapted to convert coordinates of said window into signal acquisition window coordinates of the test instrument means.

21. A system according to claim 20 in which the test instrument means is a digitizer for acquiring and digitizing a signal in time/voltage dimensions, the converting means including means defining limits of a region to which operation of the digitizer is constrained and means for the comparing the signal acquisition window coordinates to said limits.

22. A system according to claim 20 in which the instrument is a spectrum analyzer for acquiring and analyzing a signal in frequency/amplitude dimensions, the converting means including means defining limits of a region to which operation of the spectrum analyzer is constrained and means for the comparing the signal acquisition window coordinates to said limits.

23. A system according to claim 19 in which:

the test instrument is a signal generating instrument for stimulating a device under test with a signal definable in at least two dimensions;

the computer includes means for actuating the graphics and windowing software means to display a two-dimensional representation of the signal in the definition window;

the means responsive to the user input means includes means for positioning said point on a selected feature of the displayed signal and moving same to modify the selected signal feature on the display means; and the means for converting is adapted to convert coordinates of the selected signal feature into a setting of the signal feature in the test instrument means.

24. A system according to claim 23 in which the test instrument is a power supply for generating an electrical signal having user-definable current and voltage limits, the means for actuating the graphing and windowing means includes means for displaying a constrained operating region and a selected operating point of the power supply, and the operating point is movable by user operation of the input means to set the operating point of the instrument within said region.

25. A system according to claim 23 in which the instrument is a waveform generator for generating a periodic electrical signal having a waveform shape, and waveform parameters including a frequency, an amplitude, an offset and a skew which are definable by the user, the means for actuating the graphing and windowing means includes means for displaying said point on the waveform representing the setting of a selected one of said parameters, and the point is movable by user operation of the input means to set the selected waveform parameter of the instrument.

26. A method for controlling a test instrument which provides data defining an output representation of a portion of an input test signal within a signal acquisition window of at least two dimensions in a test instrument coordinate system, including first and second dimensions selectable in response to at least two computer-programmable control settings, the method including:

providing a computer having a memory, means for transmitting control settings to the test instrument, graphical display means for displaying data including said output representation in a display window of at least two dimensions in a graphical coordinate system, and user input means for a user to enter data to the computer;

storing, in the computer memory, data defining a transformation function of the test instrument for inversely transforming a selectable two-dimensional definition window into a variable set of control settings for controlling operation of the instrument in said first and second dimensions;

sending a first set of control settings to the test instrument to cause it to provide first data for an output representation of a first portion of an input test signal within a first signal acquisition window;

displaying the output representation of the first portion of the input test signal in the display window, including scaling said output representation from the instrument coordinate system to the graphical coordinate system;

entering, in the computer, data defining a user-specified definition window having first and second dimensions relative to the display window in the graphical coordinate system to define a second portion of the input test signal for the test instrument to provide;

inversely transforming the user-specified definition window in accordance with the transformation function to produce a specific set of said control settings to operate the test instrument in accordance with a second signal acquisition window substantially replicating the user-specified definition window;

controlling the test instrument with the specific set of control settings to cause it to produce second data defining an output representation of the second portion of an input test signal within the second signal acquisition window; and displaying the output representation of the second portion of the input test signal in said display window, including scaling said output representation from the instrument coordinate system to the graphical coordinate system.

27. A method according to claim 26 including:

storing each definition window specified by the user to produce a specific set of said control setting commands;

entering, in the computer, data that defines a user-specified command for recalling a selected one of the stored definition windows; and responsive to the recalling command, recalling the selected, stored definition window, regenerating the specific set of control signals therefrom, and retransmitting same to the test instrument to operate it again to produce data for an output representation of the portion of the input test signal within an acquisition window defined by the recalled definition window.

28. A method according to claim 26 in which the user input means is a graphic input device, including:

displaying, in response to operation of the graphic input device, at least two user-specified points relative to the display window and thereby graphically designating the second definition window in relation to a selected feature of the displayed output representation of the first portion of the input test signal in the display window;

transforming the user-specified points from said graphical coordinate system to an operating point in at least two dimensions in the coordinate system of the test instrument; and producing said specific set of control settings in accordance with said operating point for transmission to the test instrument to cause the test instrument to provide said second data for an output representation of said selected feature for two-dimensional display.

29. A method according to claim 28 in which the test instrument operates solely within a constrained operating region, the method further including:
storing, as a part of said transformation function, data defining the constrained operating region;
comparing said operating point to the constrained operating region; and
producing said specific set of control settings in accordance with said operating point if the operating point is within said region.

30. A method according to claim 29 in which a modified set of control settings is produced if the operating point is outside said region, production of said modified set including determining a modified operating point within said region that is nearest the operating point in the dimension of the designated feature and producing the modified set of control settings for the modified operating point.

31. A method according to claim 28 in which the test instrument operates solely within a constrained operating region, the method further including storing data defining the constrained operating region and displaying a representation of the constrained operating region and the user-specified points.

32. A method according to claim 26 in which the test instrument operates to acquire an input test signal within a two-dimensional signal acquisition window relative to an input trigger event, the method further including:
programming the computer with interactive graphics software for displaying data graphically and windowing software for displaying data within a two-dimensional definition window on the display means;
storing display coordinates of the user-specified definition window in the computer memory and displaying same on the display means;
transforming the display coordinates of the definition window to two-dimensional coordinates whereby an acquisition window is defined by start and end values in a first dimension and by lowest and highest values in a second dimension; and
generating said control settings in accordance with said start and end values and lowest and highest values.

33. A method according to claim 32 in which the test instrument operates within an operating region constrained in at least one dimension, including:
storing data defining the constrained operating region; and
comparing the signal feature coordinates in at least said one dimension to the constrained operating region;
the set of control settings being generated in accordance with said values if the operating point is within said region and, otherwise, in accordance with a modified set of said values that most closely accommodate the acquisition window defined by the user.

34. A method according to claim 32 in which the first dimension represents time relative to said input trigger event, including:
selecting a sample interval and number of samples whose product approximates a difference between the end and start values of the acquisition window and a delay from the input trigger event such that a first and a last of said number of samples substantially coincide with said start and end values, respectively; and
controlling operation of the test instrument in the first dimension in accordance with the selected sample interval, number of samples and delay.

35. A method according to claim 32, which includes:
storing a set of sampling rates, a maximum number of samples allowed, and a maximum and minimum delay from said input trigger event;
selecting a delay, a number of samples and the highest one of the set of sample rates such that:
delay is at least as great as the minimum delay and no greater than the maximum delay;
the number of samples required at such rate between the start and end values is no greater than the maximum number of samples allowed;
the start value is at least as great as the delay divided by sample rate; and
the end value is no greater than the delay plus the number of samples required divided by sample rate and
controlling operation of the test instrument in the first dimension in accordance with the selected sample interval, number of samples and delay.

36. A method according to claim 32, in which the test instrument operates within an operating region constrained in at least the second dimension and the second dimension represents amplitude relative to a predetermined origin, including:
storing parameters which define a set of ranges in the second dimension and a minimum and a maximum offset that can be added to each range in the set;
selecting from said set a range in the second dimension that is greater than the difference between the highest and lowest values of the display coordinates of the desired window in the second dimension and an offset of a center point of the selected range from the origin in the second dimension such that the lowest and highest values of the range are positioned between or coincide with a lowest and a highest setting, respectively, allowed in the second dimension by the test instrument; and
controlling the test instrument in accordance with the selected range and offset, thereby causing the test instrument to acquire signal data from a device under test in accordance with a signal acquisition window determined by the desired signal acquisition window.

37. A method of according claim 32 in which the second dimension represents amplitude relative to a predetermined origin, including:
storing parameters which define a set of ranges in the second dimension and a minimum and a maximum offset that can be added to each range in the set, the maximum and minimum offsets being stored as percentages of offset allowed each range;
selecting the smallest one of the stored range settings and an offset for operation of the test instrument in the second dimension such that:
(1) offset is the minimum of
(a) the maximum percentage offset allowed, or
(b) the maximum of either
(i) the minimum percentage offset allowed, or (ii) the percentage of a midpoint between the highest and lowest values of the acquisition window divided by the selected range; and (2) offset multiplied by the selected range plus the selected range divided by two is at least as great as the lowest value of the acquisition rectangle; and (3) offset multiplied by the selected range less the selected range divided by two is no greater than the highest value of the acquisition rectangle; and controlling the test instrument in accordance with the selected range and offset.

38. A method according to claim 32 in which:

the test instrument is a programmable test instrument having a first processor for generating said control settings;

the computer includes a second processor programmed with said interactive graphics and windowing software for controlling the graphical display and external communications for transmitting commands to the first processor and transmitting data from the test instrument to the second processor;

the user-specified definition window is formed by operation of the windowing and interactive graphics software in the second processor; and controlling the test instrument is performed by the first processor in response to a command from the second processor.

* * * * *